(12) United States Patent
Kelly et al.

(10) Patent No.: US 10,163,623 B1
(45) Date of Patent: Dec. 25, 2018

(54) ETCH METHOD WITH SURFACE MODIFICATION TREATMENT FOR FORMING SEMICONDUCTOR STRUCTURE

(71) Applicant: TAIWAN SEMICONDUCTOR MANUFACTURING CO., LTD., Hsinchu (TW)

(72) Inventors: Andrew Joseph Kelly, Hsinchu County (TW); Yi-Hsiu Chen, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/799,489

(22) Filed: Oct. 31, 2017

(51) Int. Cl.
*H01L 21/02* (2006.01)
*H01L 21/311* (2006.01)
*H01L 29/66* (2006.01)
*H01L 21/8238* (2006.01)
*H01L 21/762* (2006.01)

(52) U.S. Cl.
CPC .... *H01L 21/0217* (2013.01); *H01L 21/02123* (2013.01); *H01L 21/02129* (2013.01); *H01L 21/02164* (2013.01); *H01L 21/02236* (2013.01); *H01L 21/02343* (2013.01); *H01L 21/02359* (2013.01); *H01L 21/02524* (2013.01); *H01L 21/02532* (2013.01); *H01L 21/31111* (2013.01); *H01L 21/76224* (2013.01); *H01L 21/823821* (2013.01); *H01L 29/66545* (2013.01); *H01L 29/66795* (2013.01)

(58) Field of Classification Search
CPC ......... H01L 21/31111; H01L 21/02164; H01L 21/02236; H01L 21/76224; H01L 21/823821; H01L 29/66545; H01L 29/66795; H01L 21/0217; H01L 21/02123; H01L 21/02129; H01L 21/02524; H01L 21/02532; H01L 21/02343; H01L 21/02359; C01B 21/068
See application file for complete search history.

(56) References Cited

U.S. PATENT DOCUMENTS 8,097,538 B2 * 1/2012 Koide ................ H01L 21/0206
257/E21.428
8,836,016 B2 9/2014 Wu et al.
(Continued)

*Primary Examiner* — Scott B Geyer
(74) *Attorney, Agent, or Firm* — Maschoff Brennan

(57) ABSTRACT

An etching method with a surface modification treatment for forming a semiconductor structure is provided. The method includes providing a semiconductor substrate, forming a silicon nitride (SiN) layer on the semiconductor substrate, and forming a silicon-containing layer on the semiconductor substrate and beside the SiN layer. The silicon-containing layer includes a silicon dioxide layer, a n-type silicon-containing layer, a p-type silicon-containing layer or a combination thereof. The method further includes performing a surface modification treatment onto the SiN layer and the silicon-containing layer by using a surface modification solution, thereby forming a modified layer on the SiN layer and the silicon-containing layer. The method further includes removing a portion of the modified layer and its underlying SiN layer by a wet etching operation, while the other portion of the modified layer and its underlying silicon-containing layer remain, and removing the other portion of the modified layer.

20 Claims, 30 Drawing Sheets

(56) References Cited

U.S. PATENT DOCUMENTS

| | | |
|---|---|---|
| 8,841,701 B2 | 9/2014 | Lin et al. |
| 8,847,293 B2 | 9/2014 | Lee et al. |
| 8,853,025 B2 | 10/2014 | Zhang et al. |
| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,520,482 B1 | 12/2016 | Chang et al. |
| 9,576,814 B2 | 2/2017 | Wu et al. |
| 2012/0264308 A1* | 10/2012 | Watanabe ........... H01L 21/3105 438/757 |
| 2017/0356084 A1* | 12/2017 | Nakanishi ........... H01L 21/0217 |

* cited by examiner

US 10,163,623 B1

ETCH METHOD WITH SURFACE MODIFICATION TREATMENT FOR FORMING SEMICONDUCTOR STRUCTURE

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

A wet etching operation performed on a sacrificial layer (e.g. silicon nitride) is common in a semiconductor manufacturing process. However, for the wet etching operation, insufficient selectivity between the sacrificial layer and its underlying or nearby layers and a loading effect in which an etch rate highly depends on an etched structure result in difficulty in controlling the etch rate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
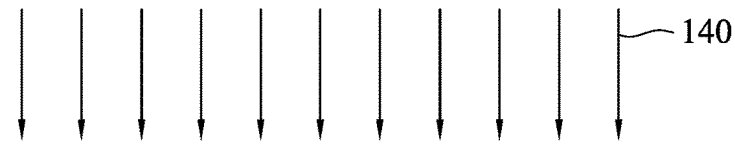
FIG. 1A through FIG. 1D are schematic cross-sectional views of intermediate stages showing an etching method with a surface modification treatment for forming a semiconductor structure in accordance with various embodiments of the present disclosure.
Figure 1A:
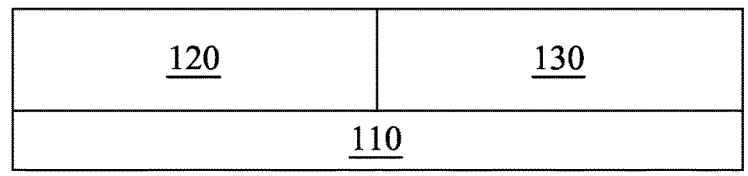

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Silicon nitride (SiN) is widely used as a sacrificial layer in various semiconductor manufacturing processes, such as formation of a semiconductor device with a replaceable source/drain stressor (RSS) on a channel area, formation of an air gap core semiconductor device or a source/drain region patterning process of a complementary oxide-metal semiconductor (CMOS) device. Typically, the SiN layer is formed on a semiconductor substrate, and a silicon-containing layer including oxide, a n-type material or a p-type material may be formed beside or under the SiN layer, in which the silicon-containing layer may be a source/drain region, or a sacrificial layer for other processes. The SiN sacrificial layer is then removed by a wet etching operation directly using hot phosphoric acid, and the silicon-containing layer is likely to be exposed during the wet etching operation. However, the hot phosphoric acid is lack of selectivity between the SiN layer and the nearby silicon-containing layer, thus causing damages to the silicon-containing layer. Furthermore, an etching rate of the hot phosphoric acid approach highly depends on a structure to be etched, for example, a seam structure may be etched much faster (i.e. high loading effects), causing an uneven etch depth.

Embodiments of the present disclosure are directed to providing an etching method with a surface modification treatment for forming a semiconductor structure. Briefly, a surface modification treatment is performed on the SiN layer and the silicon-containing layer during the wet etching operation for removing the SiN layer, thereby forming a modified layer on the SiN layer and the silicon-containing layer. The modified layer formed on the SiN layer has less selectivity than the modified layer formed on the silicon-containing layer, and thus the modified layer formed on the SiN and its underlying SiN layer are removed by the wet etching operation while the modified layer formed on the silicon-containing layer and its underlying silicon-containing layer remain. In some embodiments, an additional wet etching operation may be performed before the surface modification treatment, followed by several cycles of the surface modification treatment and the wet etching operation mentioned above. In other embodiments, an oxidation operation may be performed before the wet etching operation to form an oxidized layer on the silicon-containing layer (or a silicon-based layer), especially when the silicon-containing layer includes the n-type material or the p-type material. The method of the present disclosure can be applied to various semiconductor manufacturing processes. It is noted that the wet etch operation mentioned in the present disclosure may be a digital etch operation.

Figure 1B:
Figure 1B:
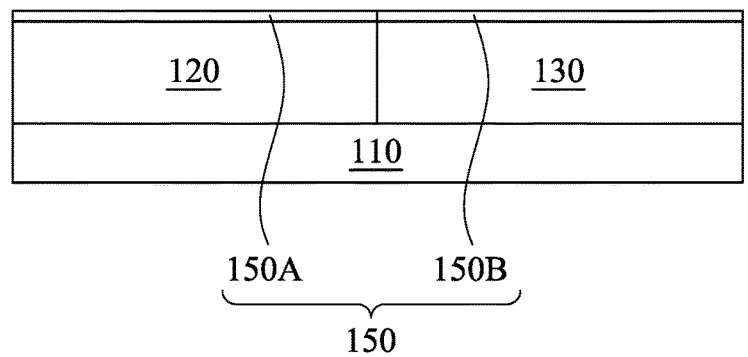

FIG. 1A through FIG. 1D are schematic cross-sectional views of intermediate stages showing an etching method with a surface modification treatment for forming a semiconductor structure in accordance with various embodiments of the present disclosure. Referring to FIG. 1A, a semiconductor substrate 110 is provided. In some embodiments, a material of the semiconductor substrate may include silicon (Si). Other commonly used materials, such as carbon, germanium, gallium, arsenic, nitrogen, indium, and/or phosphorus, and the like, may also be included in semiconductor substrate 110. A SiN layer 120 is formed on the semiconductor substrate 110, and a silicon-containing layer 130 is formed on the semiconductor substrate 110 and beside the SiN layer 120. The silicon-containing layer 130 includes a silicon dioxide layer, a n-type silicon-containing layer, a p-type silicon-containing layer or a combination thereof. A surface modification treatment 140 is performed onto the SiN layer 120 and the silicon-containing layer 130 by using a surface modification solution, thereby forming a modified layer 150 on the SiN layer 120 and the silicon-containing layer 130, as shown in FIG. 1B. In some embodiments, the surface modification solution includes a silicon-containing compound, such as N,N-(dimethylamino)trimethylsilane. In some embodiments, surface modification solution further includes a solvent, such as propylene glycol monomethyl ether acetate (PGMEA). In some embodiments, the surface modification treatment 140 is performed for a period of substantially 5 seconds to 300 seconds under a temperature of substantially 120° C.–170° C. When the surface modification treatment 140 is performed less than 5 seconds or at a temperature lower than 120° C., the modified layer 150 may not be formed. In some embodiments, a thickness of the modified layer 150 is in a range substantially from 0.05 nm-0.2 nm.

Figure 1C:
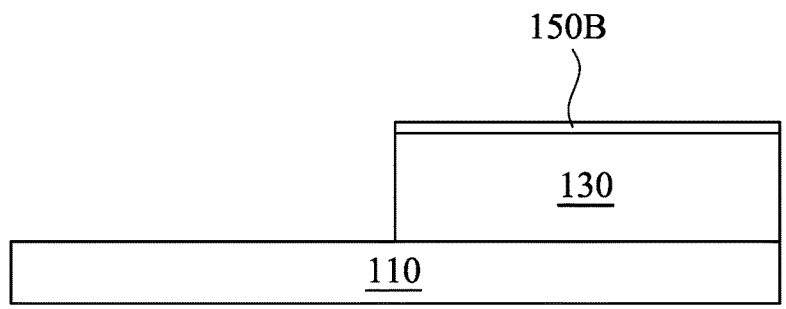

Referring to FIG. 1B, a wet etching operation 160 is performed to remove a portion 150A of the modified layer 150 and its underlying SiN layer 120, while a portion 150B of the modified layer 150 and its underlying silicon-containing layer 150B remain, as shown in FIG. 1C. In some embodiments, the portion 150A is different from the portion 150B. In the embodiments where the silicon-containing layer 130 includes silicon dioxide, the portion 150A is formed by a covalent bond-forming reaction between a nitrogen atom of the SiN layer 120 and a silicon atom of the silicon-containing compound, while the portion 150B is formed by a covalent bond-forming reaction between an oxygen atom of the silicon-containing layer 130 and the silicon atom of the silicon-containing compound. The covalent bond in the portion 150A is much weaker than the covalent bond in the portion 150B, and thus selectivity to the silicon-containing layer 130 is improved during the wet etching operation.

In some embodiments, the wet etching operation 160 is performed by applying phosphoric acid-containing solution. In further embodiments, the phosphoric acid-containing solution may include a solvent such as water, and an additive such as silica with a concentration of about 0 to about 200 ppm. In one example, the additive may further include wafer fragments which come from a previous wet etching operation in which a wafer (e.g. a SiN wafer) is immersed in the phosphoric acid-containing solution and some portions of the wafer fall off and remain in the solution. Both the silica and the wafer fragments help to prevent damages of the silicon-containing layer 130. In some embodiments, the wet etching operation 160 is performed for a period of substantially 5 seconds to 300 seconds under a temperature of substantially 120° C.-170° C. When the wet etching operation 160 is performed over 300 seconds, damages to the silicon-containing layer 130 are likely to occur. When the wet etching operation 160 is performed less than 5 seconds or at the temperature lower than 120° C., the etching efficiency becomes poor.

In some embodiments, before removing the portion 150A of the modified layer 150 and its underlying SiN layer 120, a first oxidation operation (not shown) may be performed on the silicon-containing layer 130, especially when the silicon-containing layer 130 includes the n-type silicon-containing layer or the p-type silicon-containing layer. For example, when the silicon-containing layer 130 is a silicon-based layer made of silicon phosphide (SiP) or silicon germanium (SiGe), the first oxidation operation may be performed to form a first oxidized layer (i.e. a silicon dioxide layer) on the silicon-containing layer 130, so as to provide a further protection to the silicon-containing layer 130 from being damaged by the wet etching operation 160. In a further embodiment, the first oxidation operation may be performed before the surface modification treatment 140.

In some embodiments, the first oxidation operation is performed by applying an oxidizing solution to the silicon-containing layer 130. The oxidizing solution may include, for example, aqueous ozone, hydrogen peroxide, a mixture of hydrogen peroxide and ammonium hydroxide, a mixture of sulfuric acid and hydrogen peroxide, or a mixture of hydrochloric acid and hydrogen peroxide. In a further embodiment, the oxidizing solution further includes a solvent, such as water, ethanol or isopropyl alcohol. Generally, the first oxidation operation is performed for a period of substantially 5 seconds to 300 seconds under a temperature of substantially 5° C. to 120° C. In some embodiments, a thickness of the first oxidized layer is in a range substantially from 0.6-1 nm.

Figure 1D:
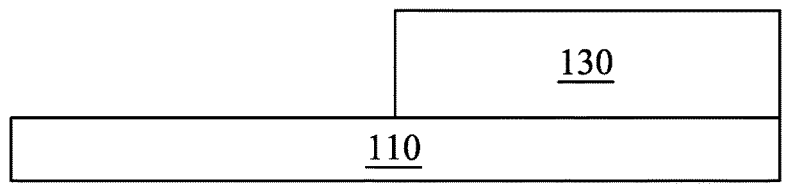

Referring to FIG. 1D, the portion 150B is removed by, for example, performing a second oxidation operation. The second oxidation operation is performed to form a second oxidation layer, and then the second oxidation layer may be removed by a pre-clean process. In one example, the pre-clean process is a SiCoNi epitaxy pre-clean process. In other embodiments, the portion 150B may be directly removed by performing a diluted hydrogen fluoride (DHF) cleaning operation.

Figure 2A:
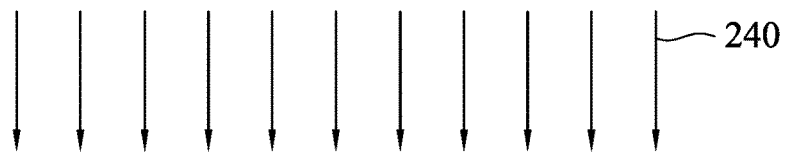
FIG. 2A through FIG. 2H are schematic cross-sectional views of intermediate stages showing an etching method with a surface modification treatment for forming a semiconductor structure in accordance with other embodiments of the present disclosure.

FIG. 2A through FIG. 2H are schematic cross-sectional views of intermediate stages showing an etching method with a surface modification treatment for forming a semiconductor structure in accordance with other embodiments of the present disclosure. Referring to FIG. 2A, a semiconductor substrate 210 is provided. A SiN layer 220 and a silicon-containing layer 230 are formed on the substrate 210, and the silicon-containing layer 230 is besides the SiN layer 220. Details about the formation and the material of the semiconductor substrate 210, the SiN layer 220 and the silicon-containing layer 230 of FIG. 2A are similar to the formation and the material of the semiconductor substrate 110, the SiN layer 120 and the silicon-containing layer 130 of FIG. 1A, and may not be repeated herein.

Figure 2B:
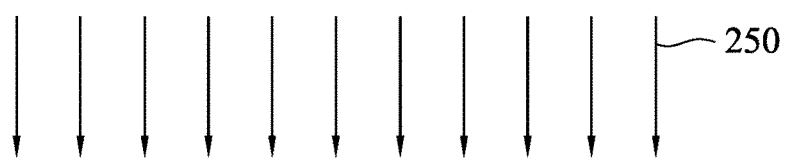
Figure 2B:
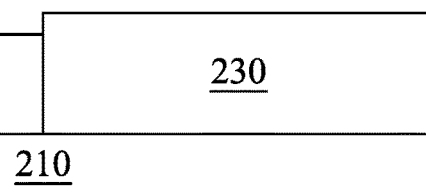
Figure 2C:
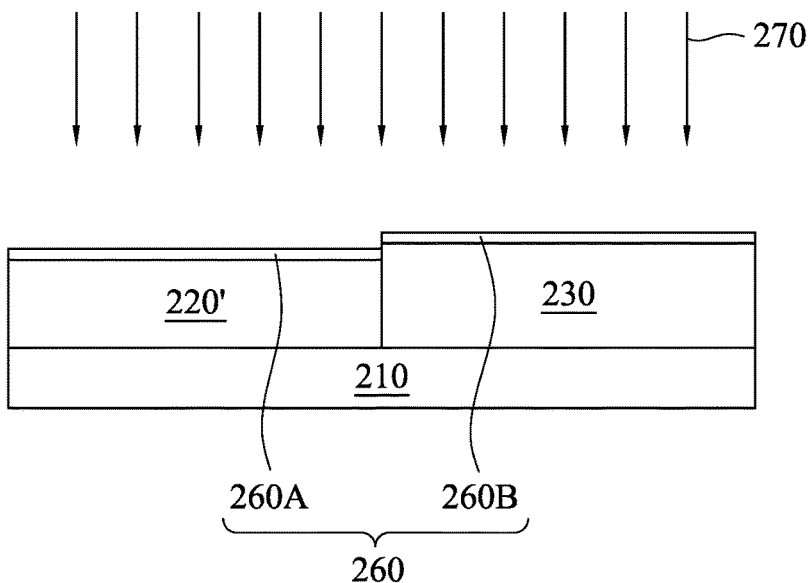
Figure 2D:
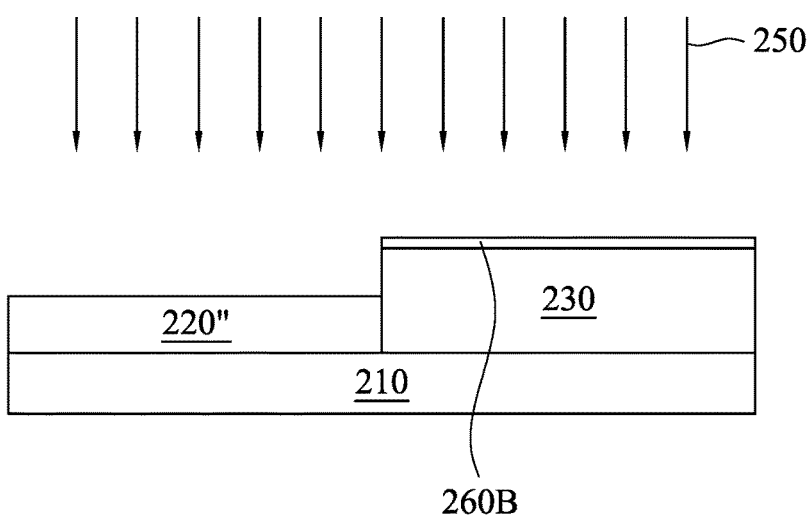

As shown in FIG. 2A, a first wet etching operation 240 is performed on the SiN layer 220 and the silicon-containing layer 230, thereby removing a first portion of the SiN layer 220 and exposing a second portion 220' of the SiN layer 220 while the silicon-containing layer 230 remains. It is noted that the silicon-containing layer 230 can remain without a significant damage during the first wet etching operation 240 because the length of the wet operation is short. However, when the silicon-containing layer 230 is exposed to the wet etching solution during a whole process for removing the SiN layer 220, damages to the silicon-containing layer 230 are likely to occur. As shown in FIG. 2B-FIG. 2D, an etching cycle includes a surface modification treatment 250 and a second wet etching operation 270. After the first wet etching operation 240 in FIG. 2A, the surface modification treatment 250 (FIG. 2B) is performed onto the second portion 220' of the SiN layer 220 and the silicon-containing layer 230 by applying a surface modification solution, thereby forming a modified layer 260 as shown in FIG. 2C. Next, the second wet etching operation 270 (FIG. 2C) is performed to remove a portion 260A of the modified layer 260 and its underlying second portion 220' of the SiN layer 220 to expose a third portion 220" of the SiN layer 220, while a portion 260B of the modified layer 260 and its underlying silicon-containing layer 230 remain, as shown in FIG. 2D. The portion 260A and the portion 260B of FIG. 2C-FIG. 2G are respectively similar to the portion 150A and the portion 150B of FIG. 1B-FIG. 1C, and may not be repeated herein.

Figure 2E:
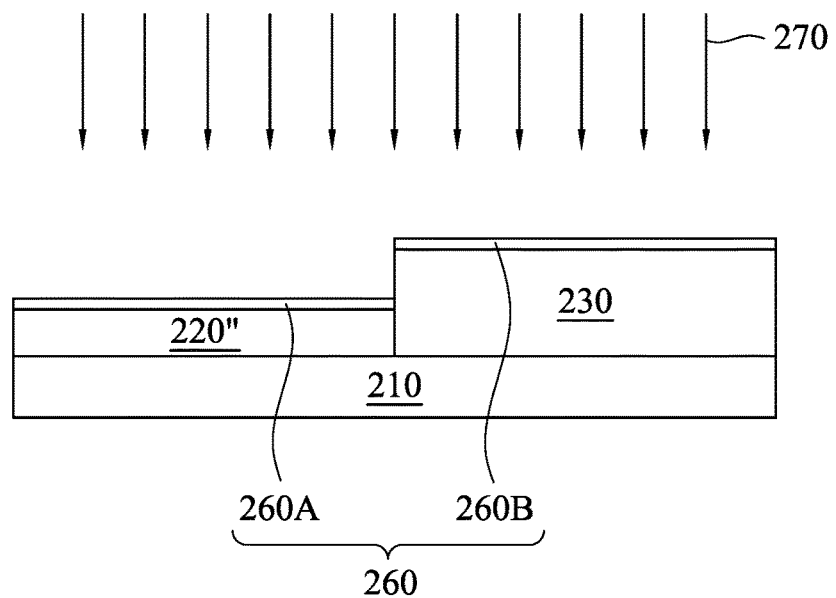
Figure 2F:
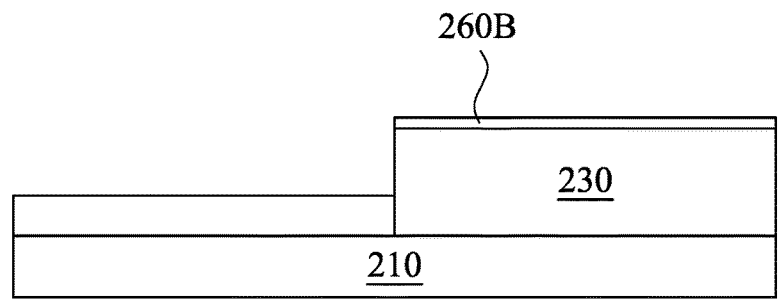
Figure 2G:
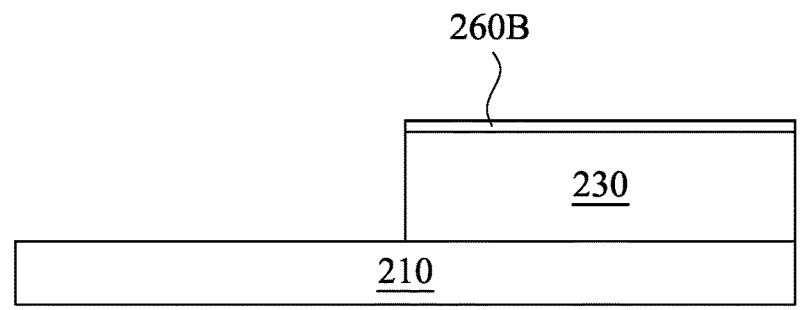

The etching cycle may be performed again, as shown in FIG. 2D-FIG. 2F, so as to remove the portion 260A of the modified layer 260 and its underlying third portion 220" of the SiN layer 220. Repeating the etching cycles for several times, and the SiN layer 220 may be completely removed, as shown in FIG. 2G. In some embodiments, the etching cycle is performed for at least one time. It is noted that a number of the etching cycle depends on a depth of the SiN layer 220 to be removed, duration of the wet etching operations or other process parameters. Although the SiN layer 220 is completely removed in FIG. 2G, in other embodiments, some portions of the SiN layer 220 may remain according to requirements of a semiconductor structure.

The first wet etching operation 240 and the second wet etching operation 270 of FIG. 2A, FIG. 2C and FIG. 2 E are similar to the wet etching operation 160 of FIG. 1B; the surface modification treatments 250 of FIG. 2B and FIG. 2D are similar to the surface modification treatment 140 of FIG. 1A, and may not be repeated herein. In addition, a first oxidation operation similar to the first oxidation operation in the embodiments of FIG. 1A to FIG. 1D may also be performed herein. For example, the first oxidation operation may be performed before the etching cycle is performed, between any two of the etching cycles, or it may be performed just before the second wet operation 270 of one or more etching cycles is performed. Details about the first oxidation operation has been described in the embodiments of FIG. 1A to FIG. 1D, and may not be repeated herein.

Figure 2H:
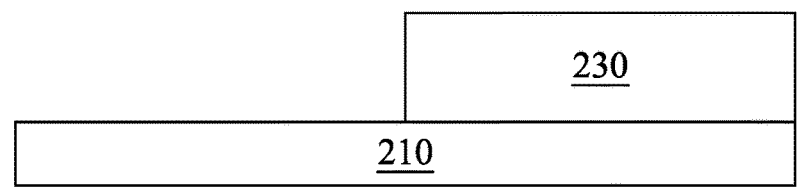

Next, the portion 260B of the modified layer 260 is removed, as shown in FIG. 2H. The method for removing the portion 260B of the modified layer 260 of FIG. 2H may take the method described in FIG. 1D by reference, and may not be repeated herein.

Figure 3A:
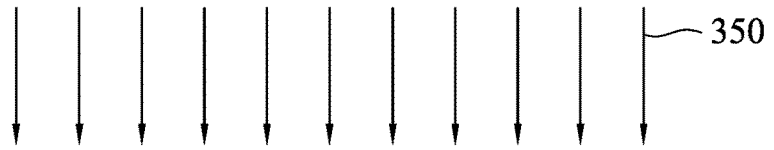
FIG. 3A through FIG. 3I are schematic cross-sectional views of intermediate stages showing an etching method with a surface modification treatment for forming a semiconductor structure in accordance with another embodiment of the present disclosure.
Figure 3A:
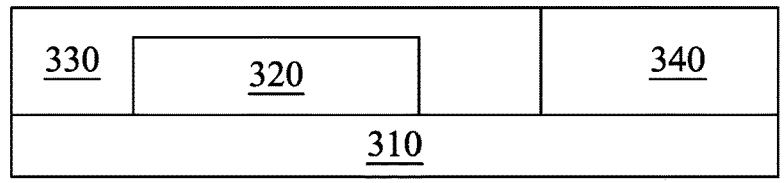

FIG. 3A through FIG. 3I are schematic cross-sectional views of intermediate stages showing an etching method with a surface modification treatment for forming a semiconductor structure in accordance with another embodiment of the present disclosure. Referring to FIG. 3A, a semiconductor substrate 310 is provided, and a silicon-based layer 320, a SiN layer 330 and a silicon dioxide ($SiO_2$) layer 340 are formed on the semiconductor substrate 310. The silicon-based layer 320 is completely covered by a portion of the SiN layer 330. A material of the silicon-based layer 320 includes a n-type silicon-based material (e.g. SiP) or a p-type silicon-based material (e.g. SiGe). The semiconductor substrate 310 is similar to the semiconductor substrate 210 of FIG. 2A and the semiconductor substrate 110 of FIG. 1A, and may not be repeated herein.

Figure 3B:
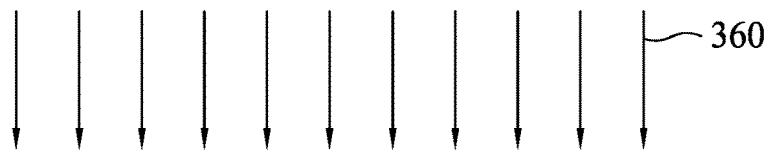
Figure 3B:
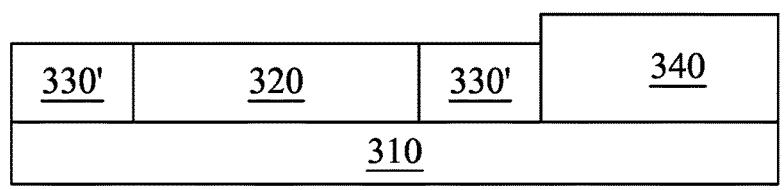
Figure 3C:
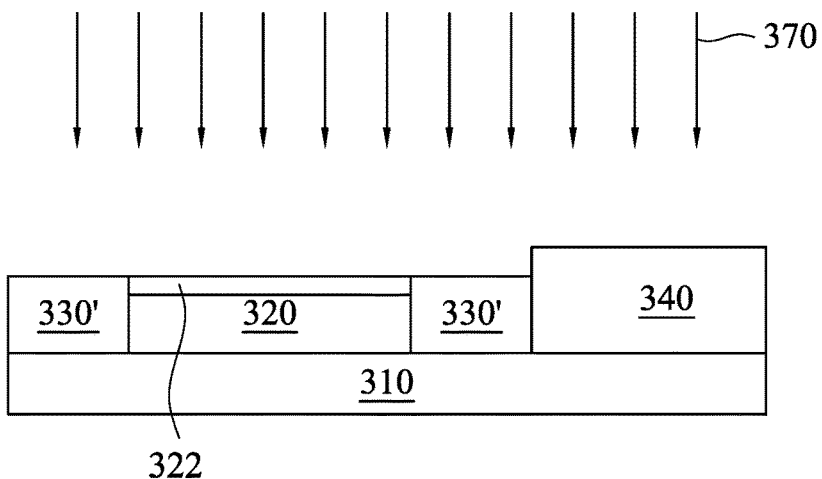

A first wet etching operation 350 (FIG. 3A) is performed on the SiN layer 330 and the $SiO_2$ layer 340, thereby removing a first portion of the SiN layer 330 while the $SiO_2$ layer 340 remains, as shown in FIG. 3B. The silicon-based layer 320 is exposed after the first wet etching operation 350, and a first oxidation operation 360 may be performed on the silicon-based layer 320 to form a first modified layer (or first oxidation layer) 322, as shown in FIG. 3C. The first oxidation operation 360 is similar to the first oxidation operation of embodiments of FIG. 1A to FIG. 1D, and may not be repeated herein. In some embodiments, a thickness of the first modified layer 322 is in a range substantially from 0.6 nm to 1 nm. It is noted that the first oxidation operation 360 is substantially performed on the silicon-based layer 320, the SiN layer 330 and the $SiO_2$ layer 340, however, the first oxidation operation 360 has little effect on the SiN layer 330 and the $SiO_2$ layer 340, and thus slight oxidation of the SiN layer 330 and $SiO_2$ layer 340 is omitted in the figures. Basically, the first modified layer 322 is made of silicon dioxide.

Figure 3D:
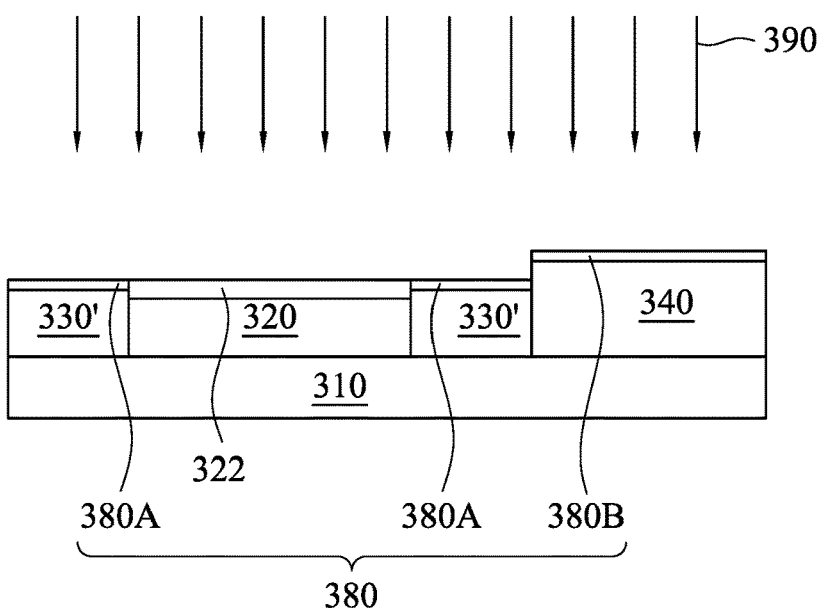
Figure 3E:
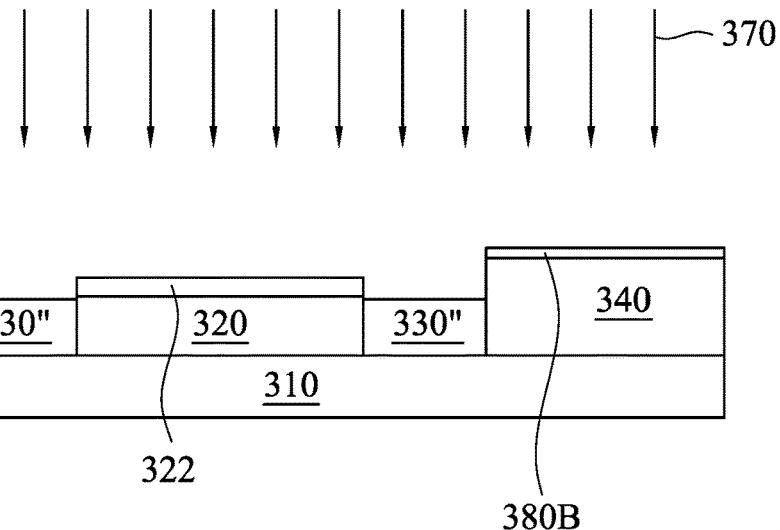

Next, plural etching cycles are performed, as shown in FIG. 3C-FIG. 3H. As shown in FIG. 3C-FIG. 3E, a single etching cycle includes a surface modification treatment 370 and a second wet etching operation 390. The surface modification treatment 370 (FIG. 3C) is performed on the second portion 330' of the SiN layer 330 and the $SiO_2$ layer 340 by applying a surface modification solution, thereby forming a second modified layer 380 on the second portion 330' of the SiN layer 330 and the $SiO_2$ layer 340, as shown in FIG. 3D. It is noted that the surface modification treatment 370 is also performed on the first modified layer 322 of the silicon-based layer and the second modified layer 380 is likely to be formed in/on the first modified layer 322 as the $SiO_2$ layer 340. However, the second modified layer of the silicon-based layer 320 is omitted to simplify the figures.

Figure 3F:
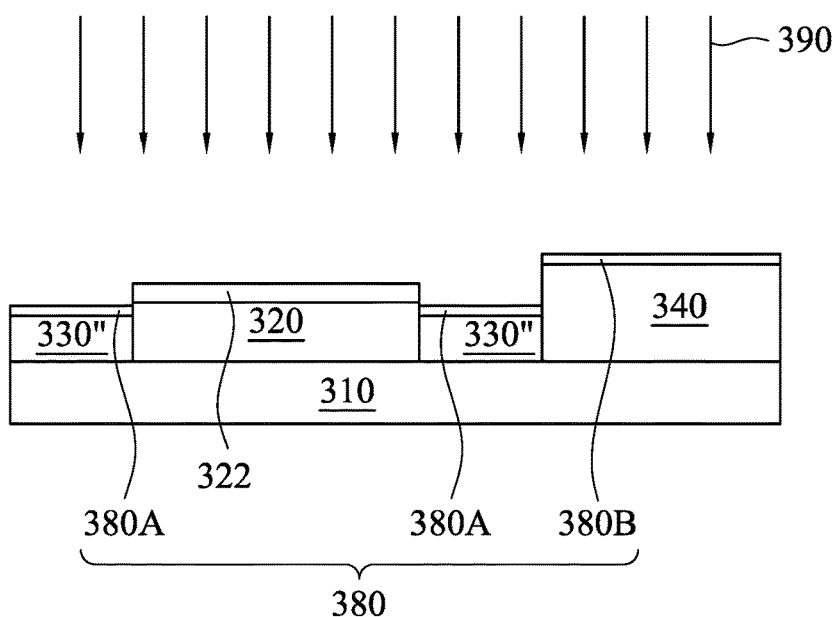
Figure 3G:
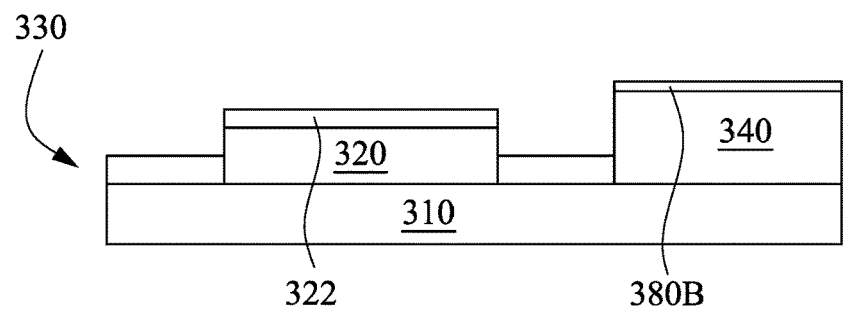
Figure 3H:
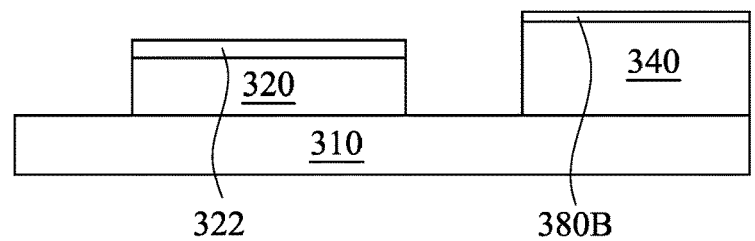

The second wet etching operation 390 (FIG. 3D) is performed to remove a portion 380A of the second modified layer 380 and its underlying second portion 330' of the SiN layer 330, while the first modified layer 322, its underlying silicon-based layer 320, the other portion 380B of the second modified layer 380, and its underlying $SiO_2$ layer 340 remain, as shown in FIG. 3E. The portion 380A and the portion 380B of FIG. 3D-FIG. 3H are respectively similar to the portion 150A and the portion 150B of FIG. 1B-FIG. 1C, and may not be repeated herein. The surface modification treatment 370 and the second wet etching operation 390 are further performed on a third portion 330" of the SiN layer 330 to form a new second modified layer and remove the SiN layer 330, as shown in FIG. 3E-FIG. 3G. Several etching cycles may be performed to completely remove the SiN layer 330, as shown in FIG. 3H, while some of the SiN layer 330 may remain after several etching cycles in other embodiments.

The first wet etching operation 350 and the second wet etching operation 390 of FIG. 3A, FIG. 3D and FIG. 3 F are similar to the wet etching operation 160 of FIG. 1B; the surface modification treatments 370 of FIG. 3C and FIG. 3E are similar to the surface modification treatment 140 of FIG. 1A, and may not be repeated herein.

Figure 3I:
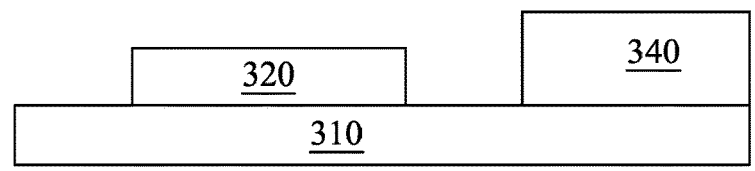

Next, the first modified layer 322 and the portion 380B of the second modified layer 380 are removed, as shown in FIG. 3I. The method for removing the portion 380B of the second modified layer 380 of FIG. 3I may take the method described in FIG. 1D by reference, and may not be repeated herein. The removal of the first modified layer 322 may be performed by the DHF cleaning operation or the SiCoNi epitaxy pre-clean operation which is known by a skilled person in the art and is not further described herein.

In embodiments of FIG. 3A-FIG. 3I, the silicon-based layer 320 is exposed after the first wet etching 350 is performed, and thus the first oxidation operation 360 is performed subsequently. Nevertheless, in other embodiments where the silicon-based layer is not exposed after the first wet etching operation, one or more etching cycles may be performed till the silicon-based layer is exposed, and the first oxidation operation is then performed to provide further protection to the silicon-based layer. Afterwards, the other one or more etching cycles may be performed to remove the SiN layer. In other words, the first oxidation operation 360 may be performed between two etching cycles in other embodiments.

The method of the present disclosure may be applied to form various fin field effect transistor (FinFET) devices. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins. Some embodiments applying the method of the present disclosure are provided in FIG. 4A-FIG. 4K, FIG. 5A-FIG. 5G and FIG. 6A-FIG. 6F. FIG. 4A through FIG. 4K are schematic cross-sectional views of intermediate stages showing an application of an etching method with a surface modification treatment for forming a semiconductor structure in accordance with some embodiments of the present disclosure. The embodiment shown in FIG. 4A through FIG. 4K is used for formation of a RSS device. A semiconductor structure 400 shown in FIG. 4A is formed by the following operations. Briefly, a fin structure 412 is formed on a semiconductor substrate 410. A dummy gate structure (not shown) is formed on the fin structure 412, and the dummy gate structure is substantially orthogonal to the fin structure 412. Next, plural trenches 414 are formed in the fin structure 412 on two opposite sides of the dummy gate structure (or a metal gate structure 440). Then, a buffer oxide layer 420 is conformally deposited in the trenches 414. Next, a SiN layer 430 is formed to fill the trenches 414 and on the buffer oxide layer 420, just as the formation of the SiN layers 120, 220 and 330 in FIG. 1A, FIG. 2A and FIG. 3A. Optionally, a chemical mechanical polishing (CMP) process is performed to planarize a top of the SiN layer 430. Next, the dummy gate structure is replaced by the metal gate structure 440, in which the metal gate structure 440 includes a metal gate layer 442 and a high-k layer 444 surrounding the metal gate layer 442. Optionally, a portion of the dummy gate remains and is used as a spacer layer 446 of the metal gate structure 440. Then, a silicon-containing layer 450 is formed over the metal gate layer 442 and the high-k layer 444, just as the formation of the silicon-containing layers 130 and 230 shown in FIG. 1A and FIG. 2A and the $SiO_2$ layer 340 shown in FIG. 3A. The semiconductor structure 400 is then formed. In some embodiments, a material of the silicon-containing layer 450 is silicon dioxide. An additional CMP process may be performed to planarize a top of the semiconductor structure 400 shown in FIG. 4A. The operations for forming the semiconductor structure 400 should be known by a skilled person in the art, and may not be further described here. It is noted that a leftmost sidewall and a rightmost sidewall of the trenches 414 are respectively shared with another metal gate structures not shown in FIG. 4A.

A first wet etching operation 460A is performed on the SiN layer 430 and the silicon-containing layer 450, thereby removing a first portion of the SiN layer 430 and exposing a second portion of the SiN layer 430 while the silicon-containing layer 450 remains. Detailed descriptions of the operation may be referred to the first wet operation 240 of FIG. 2A.

Figure 4B:
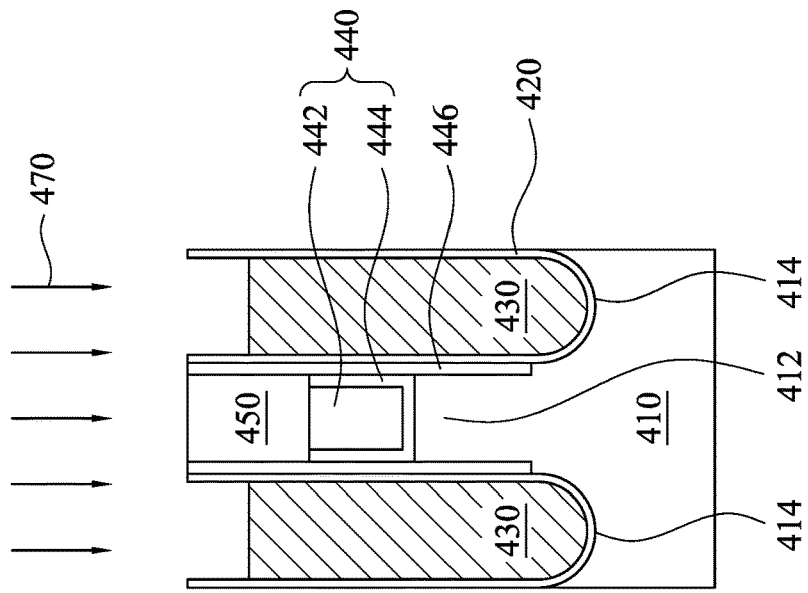
FIG. 4A through FIG. 4K are schematic cross-sectional views of intermediate stages showing an application of an etching method with a surface modification treatment for forming a semiconductor structure in accordance with some embodiments of the present disclosure.
Figure 4A:
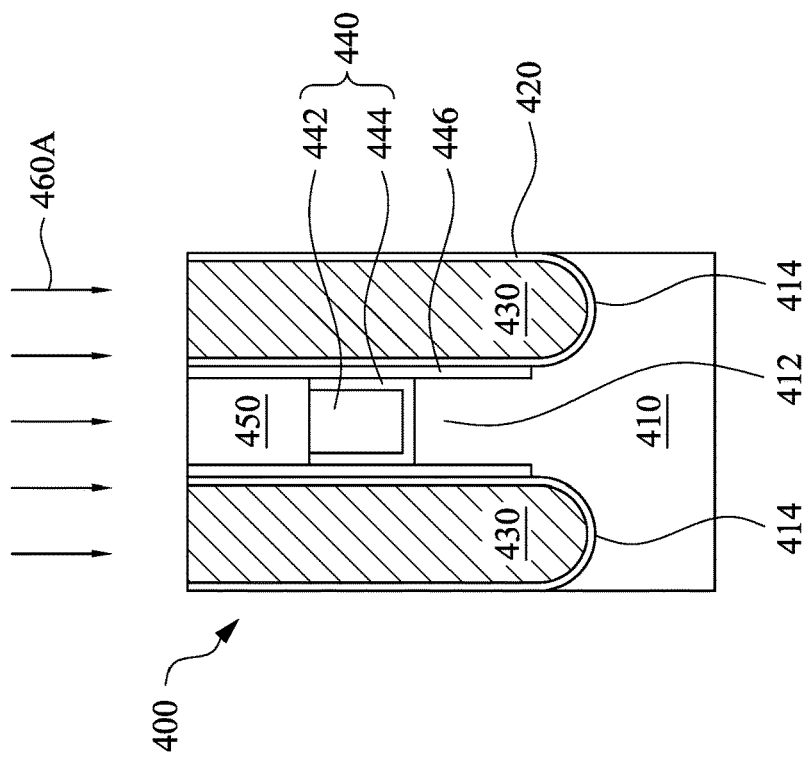
Figure 4C:
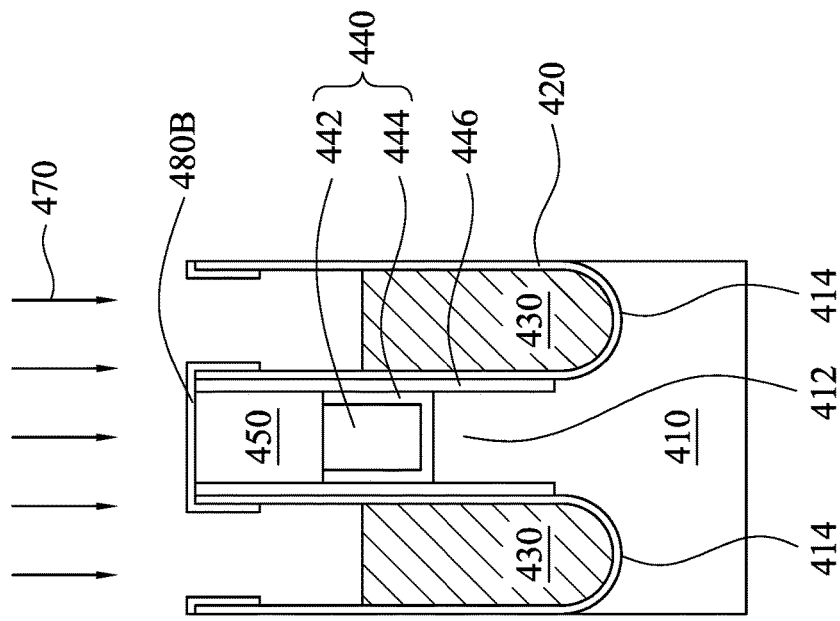
Figure 4D:
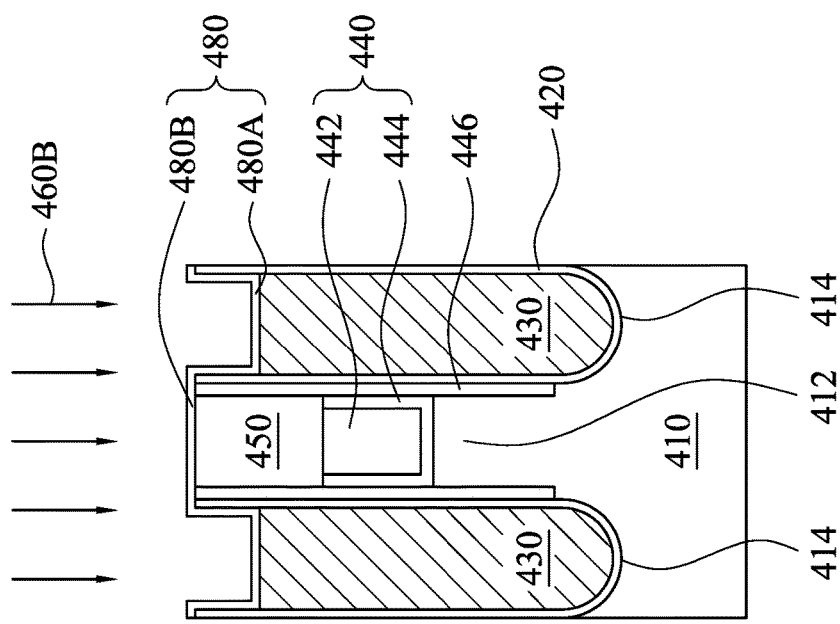

As shown in FIG. 4B-FIG. 4D, an etching cycle includes a surface modification treatment 470 and a second wet etching operation 460B. During the surface modification treatment 470, a modified layer 480 including a portion 480A and a portion 480B is formed, and the modified layer 480 may further include another portion on sidewalls of the trenches 414, as shown in FIG. 4C. The portion 480A and the portion 480B are respectively similar to the portion 260A and the portion 260B in FIG. 2B. Then, the portion 480A of the modified layer 480 and its underlying SiN layer 430 are removed while the portion 480B and its underlying silicon-containing layer 450 remain (FIG. 4D) during the second wet etching operation 460B, just as described in FIG. 2C. Detailed descriptions of the surface modification treatment 470 and the second wet etching operation 460B may be referred to the surface modification treatment 250 and the second wet etching operation 270 FIG. 2B-FIG. 2D.

Figure 4F:
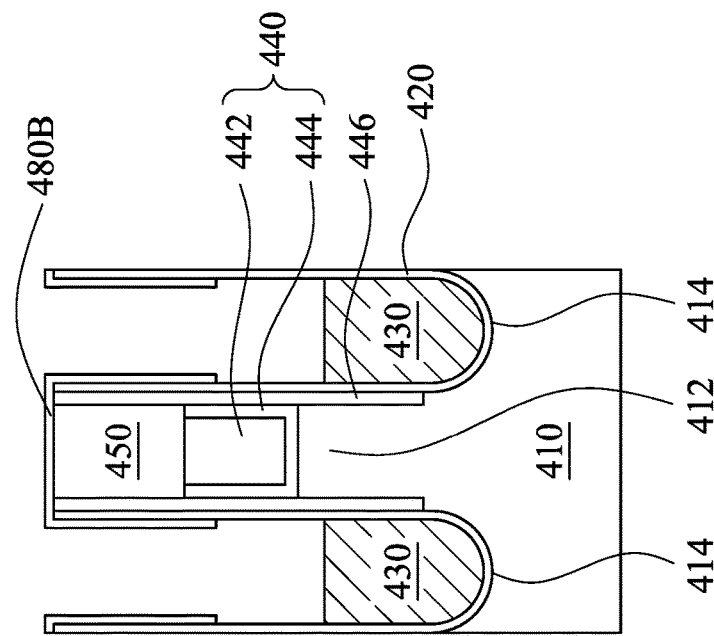
Figure 4E:
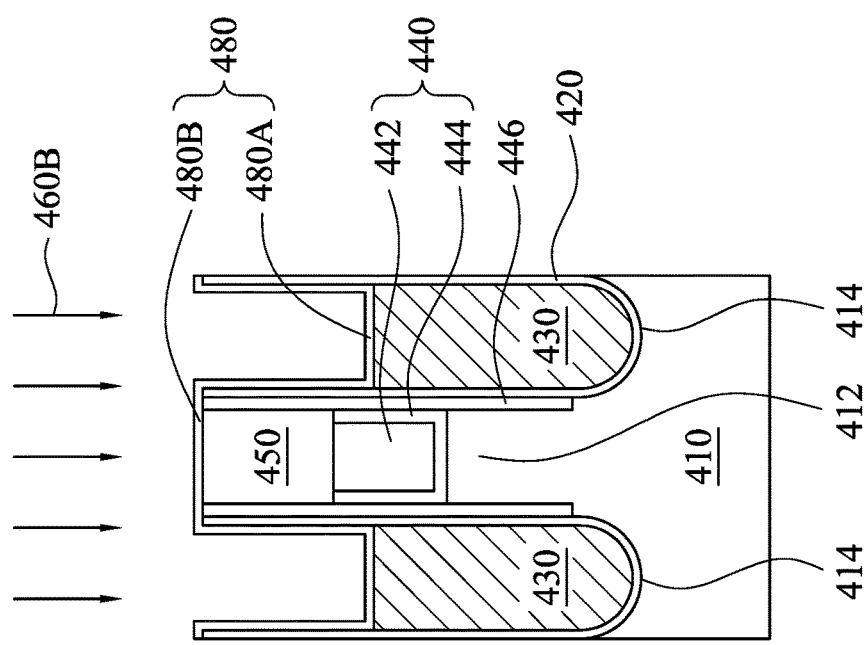
Figure 4H:
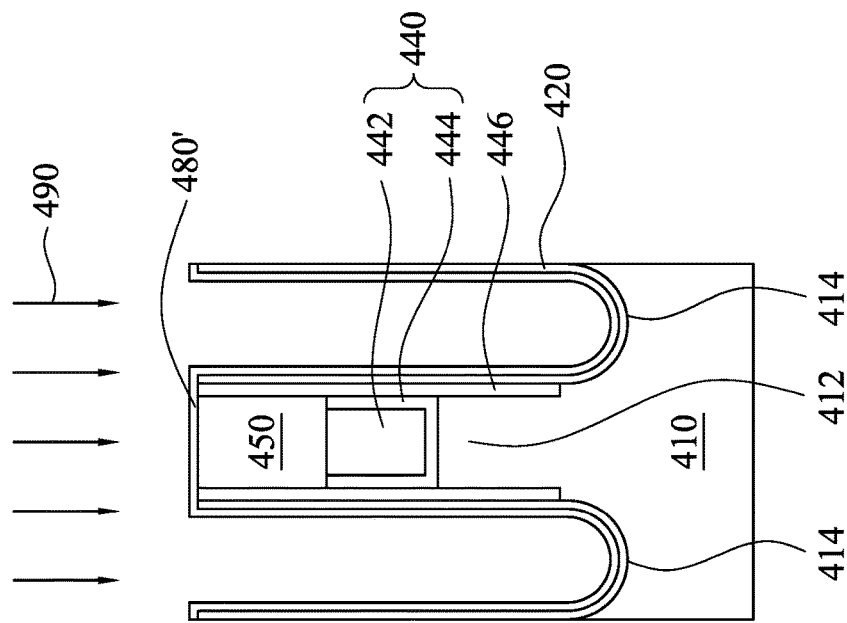
Figure 4G:
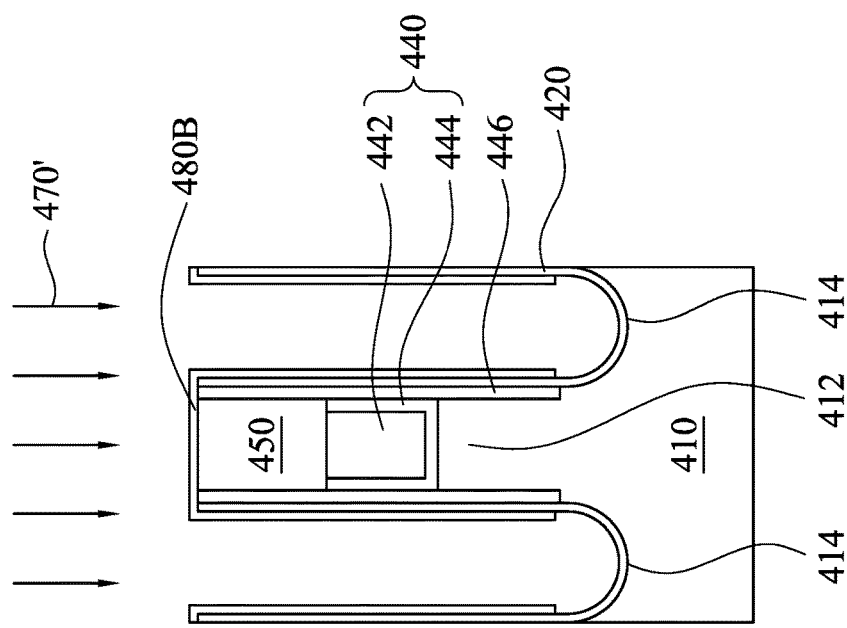

The etching cycle may be performed again, as shown in FIG. 4D-FIG. 4F, so as to remove the portion 480A of the modified layer 480 and its underlying SiN layer 430. Repeating several etching cycles, and the SiN layer 430 may be completely removed, as shown in FIG. 4G. The detailed descriptions may be referred to FIG. 2D-FIG. 2G.

Optionally, after completely removing the SiN layer 430, another surface modification treatment 470' may be performed to form a modified layer 480' to cover a top surface of the semiconductor structure. For example, the modified layer 480' may be formed on a bottom of trenches 414 and on the buffer oxide layer 420, and the modified layer 480' covers the buffer oxide layer 420 and the silicon-containing layer 450, as shown in FIG. 4H. The surface modification treatment 470' is performed in a same way as the surface modification treatment 470, and may not be repeated herein.

Figure 4J:
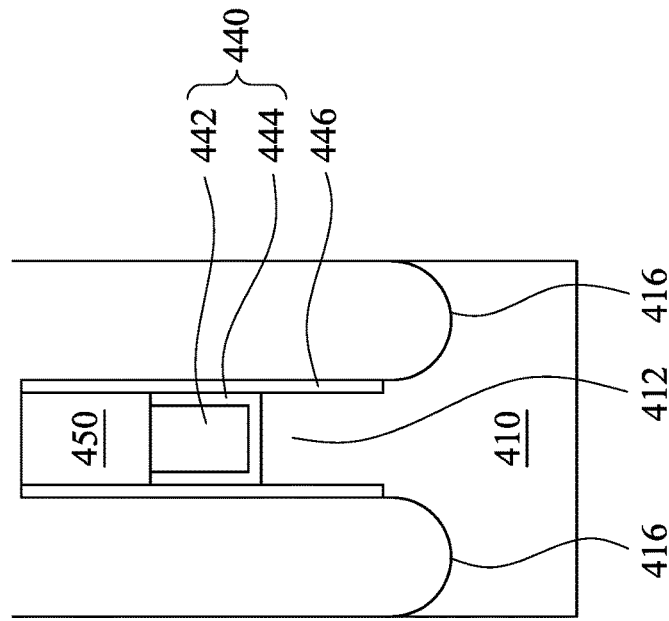
Figure 4I:
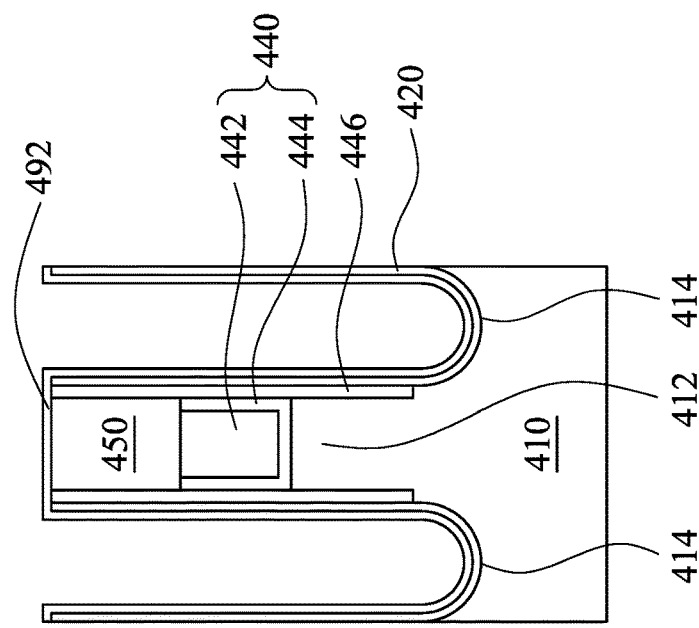

Next, an oxidation operation (e.g. the second oxidation operation described in FIG. 1D) is performed on the modified layer 480', thereby forming an oxidized layer 492. As shown in FIG. 4J, the oxidized layer 492 is then removed by, for example, the SiCoNi pre-clean operation, thereby forming trenches 416 In other embodiments, the DHF cleaning operation may be performed to directly remove the modified layer 480'. Detailed descriptions for removing the modified layer 480' may be referred to the method for removing the portion 260B of the modified layer 260 FIG. 2H.

Figure 4K:
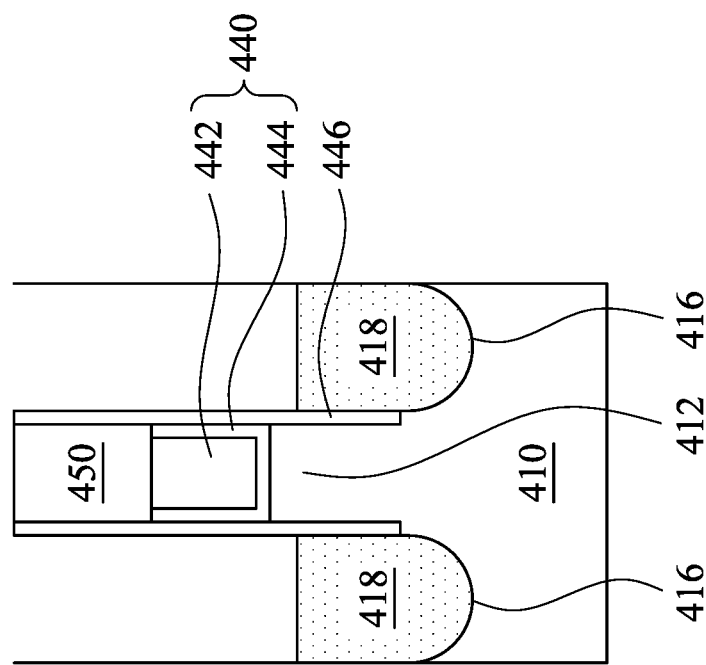

In further embodiments, a source/drain region 418 may be formed in the trenches 416, as shown in FIG. 4K. For example, a low-temperature epitaxial growth operation for growing SiP or SiGe is performed to form the source/drain region 418.

Figure 5A:
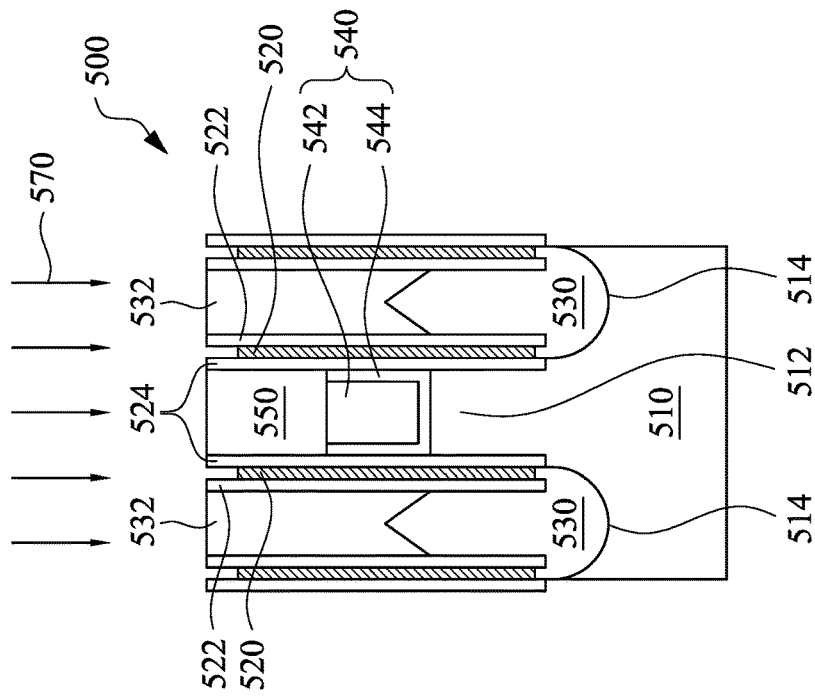
FIG. 5A through FIG. 5G are schematic cross-sectional views of intermediate stages showing an application of an etching method with a surface modification treatment for forming a semiconductor structure in accordance with other embodiments of the present disclosure.

FIG. 5A through FIG. 5G are schematic cross-sectional views of intermediate stages showing an application of an etching method with a surface modification treatment for forming a semiconductor structure in accordance with other embodiments of the present disclosure. The embodiment shown in FIG. 5A through FIG. 5G is used for formation of an air gap or a vacuum gap of a semiconductor device. A semiconductor structure 500 shown in FIG. 5A is formed by the following operations. A fin structure 512 is formed on a semiconductor substrate 510. A dummy gate structure (not shown) is formed on the fin structure 512, in which the dummy gate structure is substantially orthogonal to the fin structure 512. A SiN layer 520 is conformally formed on sidewalls of the dummy structure (may be referred to sidewalls of a metal gate structure 540 described later), just as the formation of the SiN layers 120, 220 and 330 in FIG. 1A, FIG. 2A and FIG. 3A. A first spacer layer 522 is formed, in which the first spacer layer 522 is conformal to and covers the SiN layer 520. The fin structure 512 on two opposite sides of the dummy gate structure is recessed, thereby forming trenches 514. A source/drain region 530 and an oxide layer 532 may be formed in each of the trenches 514, in which the oxide layer 532 is formed over the source/drain region 530. Optionally, a chemical mechanical polishing (CMP) process is performed to remove a portion of the SiN layer 520 and a portion of the first spacer layer 522 over the oxide layer 532 and the dummy gate structure, and thus tops of the oxide layer 532 and the dummy gate structure are exposed. Then, the dummy gate structure is replaced by the metal gate structure 540, and the metal gate structure 540 includes a metal gate layer 542 and a high-k layer 544 surrounding the metal gate layer 542. Optionally, a portion of the dummy gate structure remains and is used as a second spacer layer 524 of the metal gate structure 540. Then, forming a silicon-containing layer 550 over the metal gate layer 542 and the high-k layer 544, like the formation of the silicon-containing layers 130 and 230 shown in FIG. 1A and FIG. 2A and the $SiO_2$ layer 340 shown in FIG. 3A. In some embodiments, a material of the silicon-containing layer 550 is silicon dioxide. An additional CMP process may be performed to planarize a top of the semiconductor structure 500 shown in FIG. 5A. The operations for forming the semiconductor structure 500 should be known by a skilled person in the art, and may not be further described here. Likewise, a leftmost sidewall and a rightmost sidewall of the trenches 514 are respectively shared with another metal gate structures not shown in FIG. 5A.

A first wet etching operation 560A is performed on the SiN layer 520 and the silicon-containing layer 550, thereby removing a first portion of the SiN layer 520 and exposing a second portion of the SiN layer 520 while the silicon-containing layer 550 remains. Detailed descriptions of the operation may be referred to the first wet operation 240 of FIG. 2A.

Figure 5B:
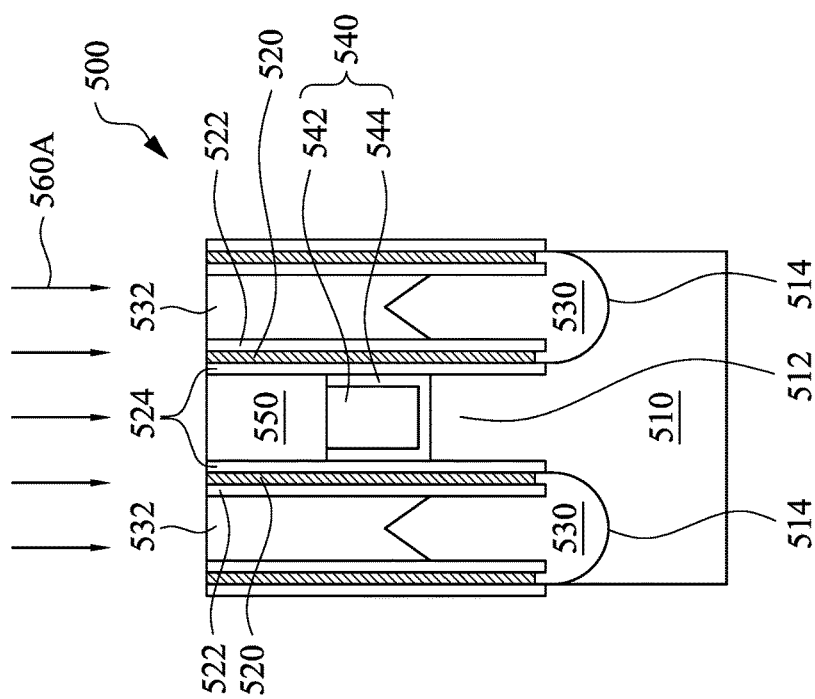
Figure 5C:
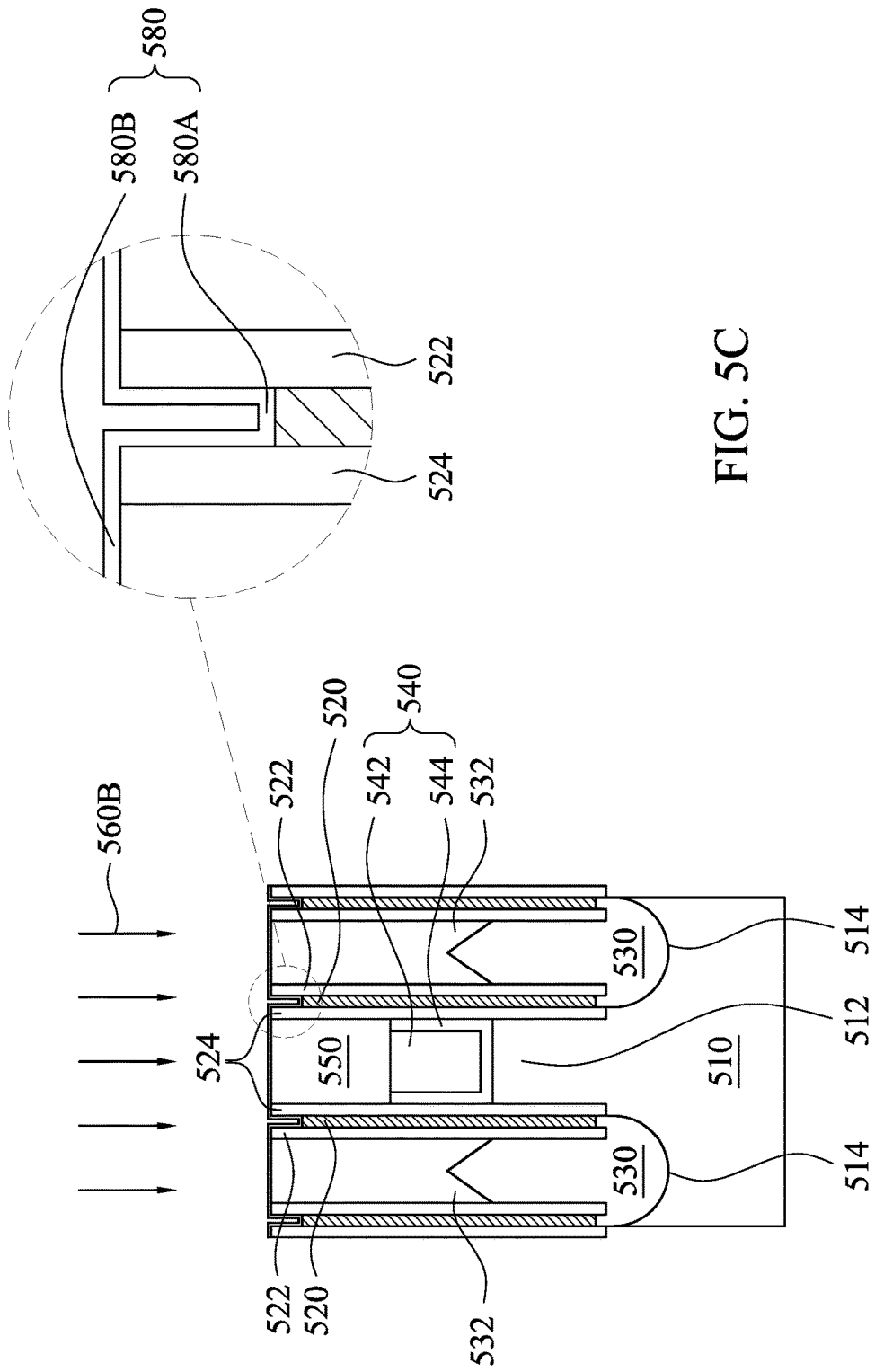
Figure 5D:
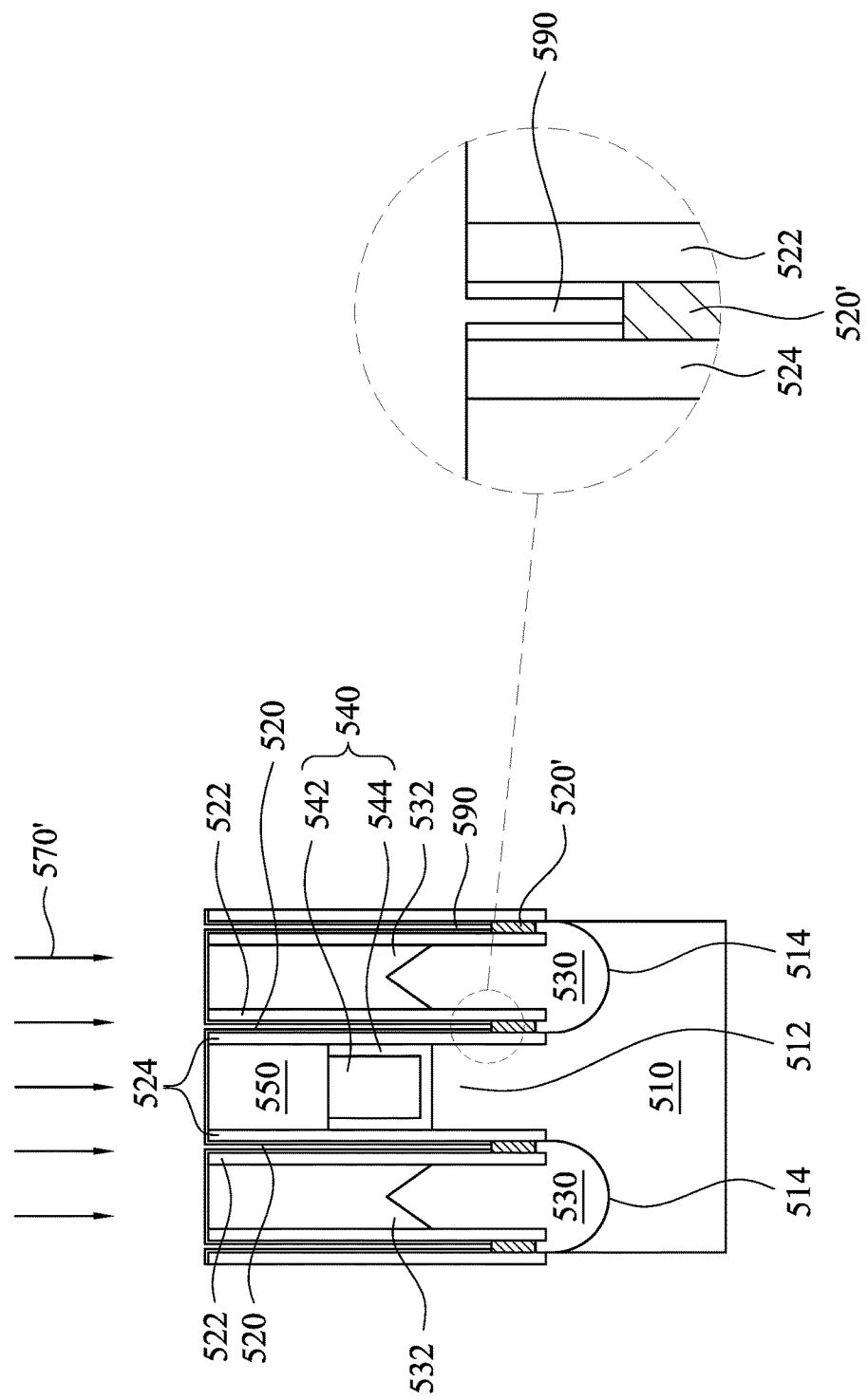

As shown in FIG. 5B-FIG. 5D, an etching cycle includes a surface modification treatment 570 and a second wet etching operation 560B. During the surface modification treatment 570, a modified layer 580 including a portion 580A and a portion 580B is formed, and the modified layer 580 may further include another portion on the first spacer layer 522 and the second spacer layer 524 (FIG. 5A), as shown in FIG. 5C. The portion 580A and the portion 580B are respectively similar to the portion 260A and the portion 260B in FIG. 2B. Then, the portion 580A of the modified layer 580 and its underlying SiN layer 520 are removed while the portion 580B and its underlying silicon-containing layer 550 remain (FIG. 5D) during the second wet etching operation 560B, just as described in FIG. 2C. Detailed descriptions of the surface modification treatment 570 and the second wet etching operation 560B may be referred to the surface modification treatment 250 and the second wet etching operation 270 in FIG. 2B-FIG. 2D. In this embodiment, a third portion 520' of the SiN layer 520 remain, and a gap 590 is formed between the first spacer layer 522 and the second spacer layer 524 and on the remaining portion (i.e. the third portion 520') of the SiN layer 520. The gap 590 may form the air gap or the vacuum gap in subsequent operations.

A first oxidation operation (e.g. the first oxidation operation mentioned in FIG. 1C and FIG. 2C, or the first oxidation operation 322 of FIG. 3B) may be optionally performed, especially when the source/drain region 530 and the fin structure 512 are likely to be exposed during the second wet etching operation 560B. The exposed portions of the source/drain region 530 and the fin structure 512 may not be seen in FIG. 5D; however, the exposed portions will be revealed in other cross-sectional views taken in a different plane from FIG. 5D.

Figure 5E:
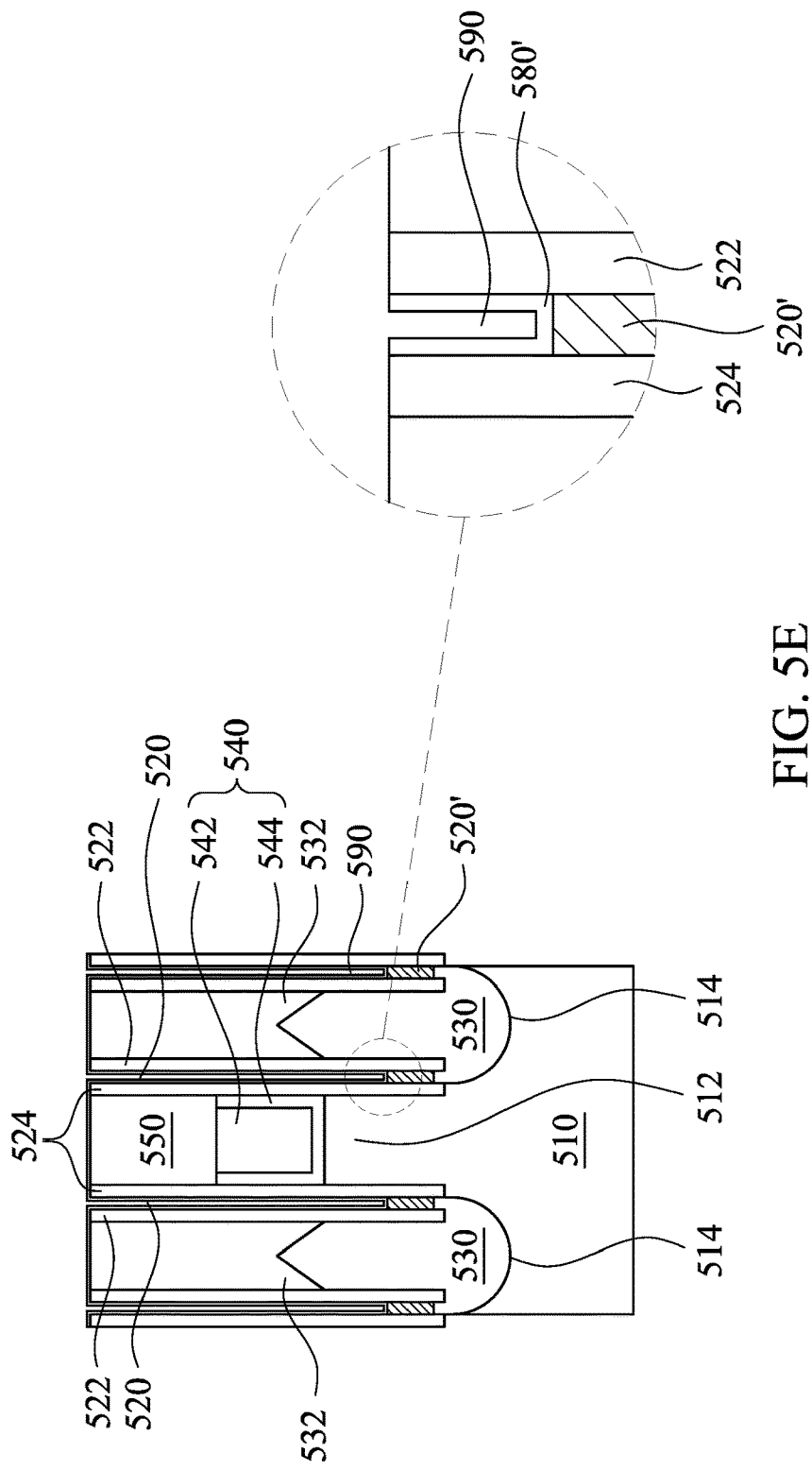

Several etching cycles may be performed to remove the portion 580A of the modified layer 580 and its underlying SiN layer 520 in other embodiments. Optionally, another surface modification treatment 570' is performed to form a modified layer 580' to cover a bottom of the gap 590, as shown in FIG. 5E. The surface modification treatment 570' is performed in a same way as the surface modification treatment 570, and may not be repeated herein.

Figure 5G:
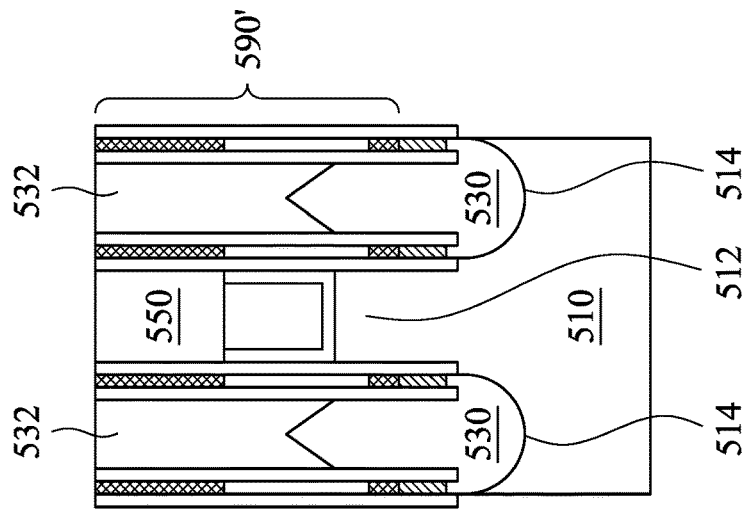
Figure 5F:
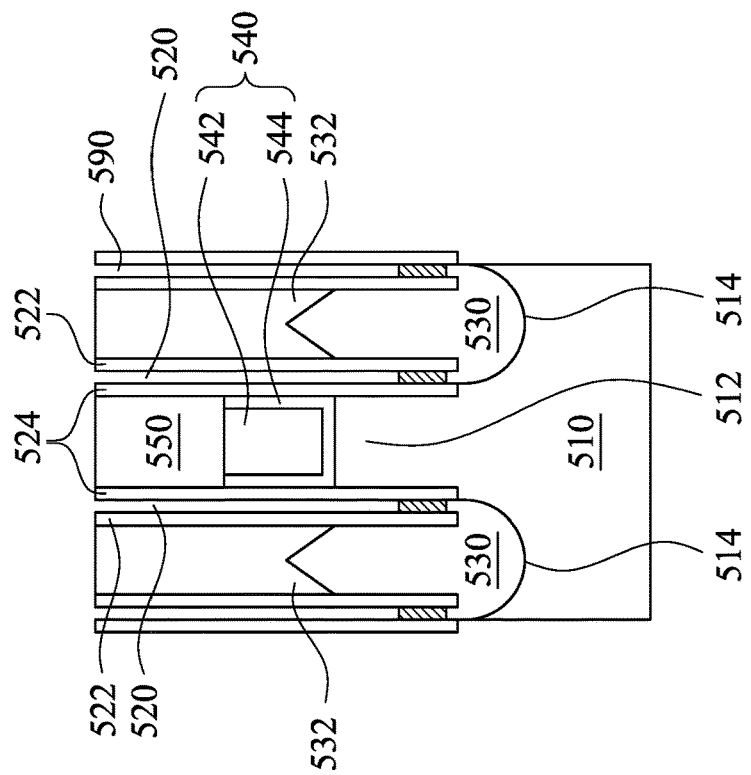

As shown in FIG. 5F, a second oxidation operation (e.g. the second oxidation operation described in FIG. 1D) is performed on the modified layer 580', followed by the SiCoNi pre-clean operation, thereby removing the modified layer 580' from the gap 590. In other embodiments, the DHF cleaning operation may be performed to directly remove the modified layer 580'. Detailed descriptions may be referred to FIG. 2H.

In a further embodiment, a dielectric material may be deposited into the gap 590, thereby forming a gap structure 590' shown in FIG. 5G. The gap structure 590' may be the air gap or the vacuum gap.

Figure 6A:
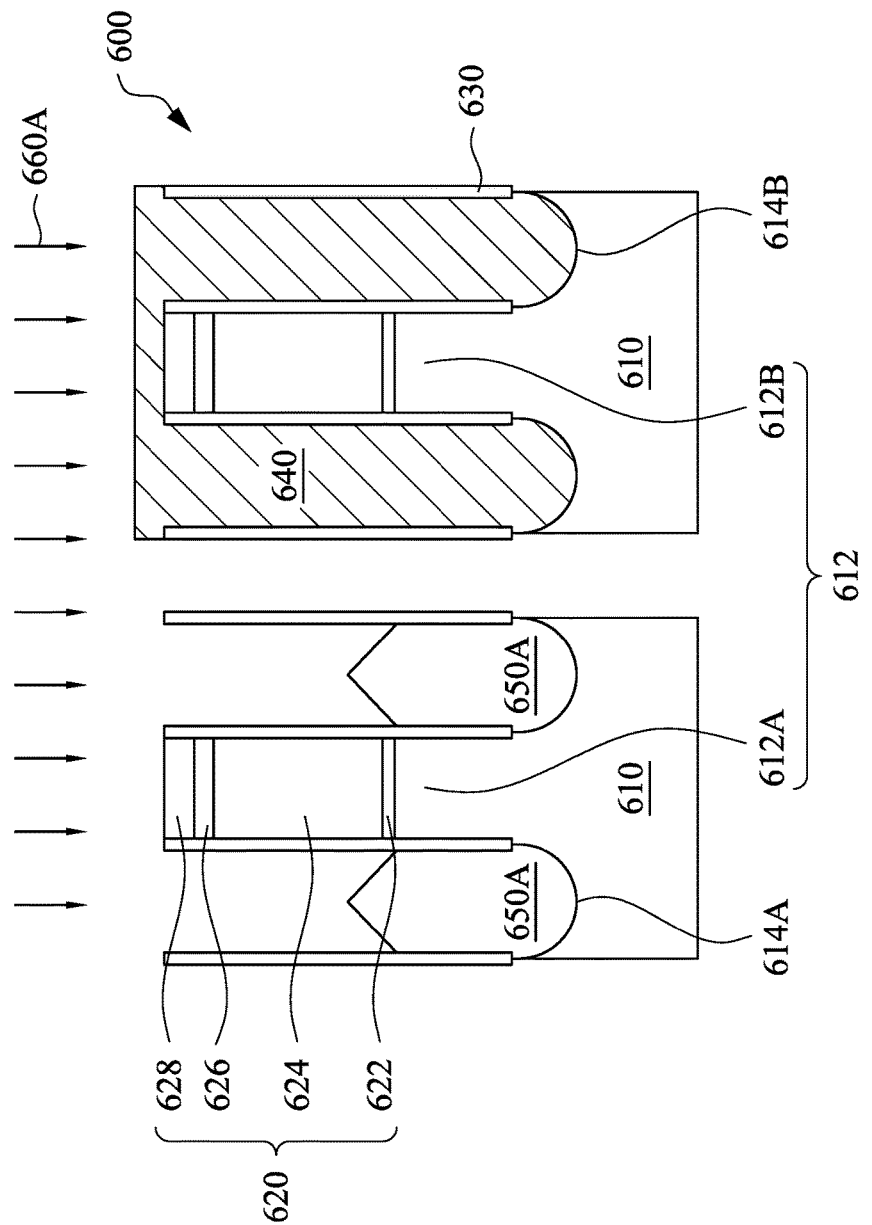
FIG. 6A through FIG. 6F are schematic cross-sectional views of intermediate stages showing an application of an etching method with a surface modification treatment for forming a semiconductor structure in accordance with another embodiments of the present disclosure.

FIG. 6A through FIG. 6F are schematic cross-sectional views of intermediate stages showing an application of an etching method with a surface modification treatment for forming a semiconductor structure in accordance with another embodiments of the present disclosure. The embodiment shown in FIG. 6A through FIG. 6F is used for a source/drain region patterning process of a CMOS device. A semiconductor structure 600 shown in FIG. 6A is formed by the following operations. A fin structure 612 is formed on a semiconductor structure 610, in which the fin structure 612 includes a first fin 612A and a second fin 612B. The first fin 612A includes a n-type material or a p-type material, and the second fin 612B includes a material opposite to the first fin 612A. For example, the first fin 612A includes silicon, and the second fin 612B includes SiGe, or vice versa. Next, dummy gate structures 620 are formed on the first fin 612A and the second fin 612B. In one example, each of the dummy gate structures 620 may include a first oxide layer (e.g. oxidized polysilicon) 622, a polysilicon gate 624, a dielectric layer (e.g. SiN) 626 and second oxide layer (e.g. $SiO_2$) 628. Then, a spacer layer 630 is formed on sidewalls of the dummy gate structure 620. The first fin 612A and the second fin 612B on two respective sides the corresponding dummy gate 620 are recessed, thereby forming first recesses 614A in the first fin 612A, and second recesses 614B in the second fin 612B. A SiN layer 640 is formed on one of each of the first recesses 614A or each of the second recesses 614B. For example, the SiN layer 640 is formed on the second recesses 614B in FIG. 6A. Then, forming a silicon-containing layer 650A in the exposed first recesses 614A. In the example where the first fin 612A includes silicon, the silicon-containing layer 650A may be a n-type material (e.g. SiP). In other example where the first fin 612A includes SiGe, the silicon-containing layer 650A may be a p-type material (e.g. SiGe).

Figure 6B:
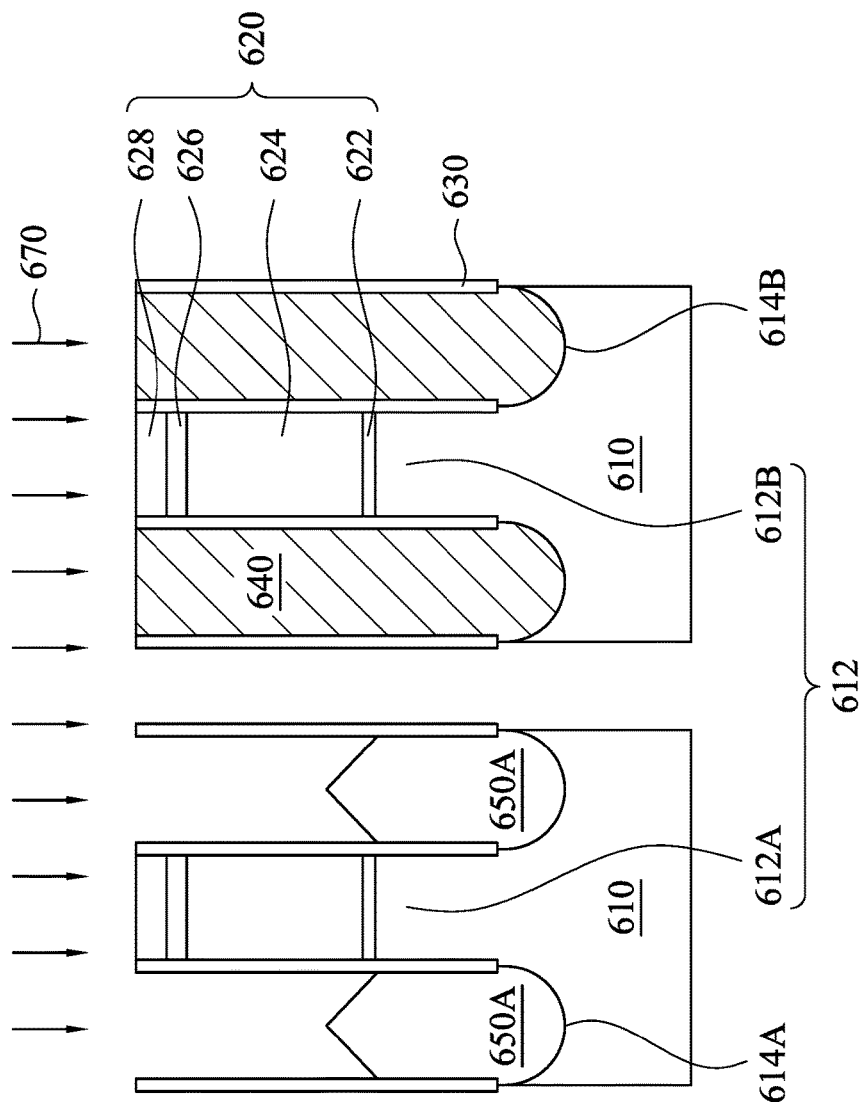
Figure 6C:
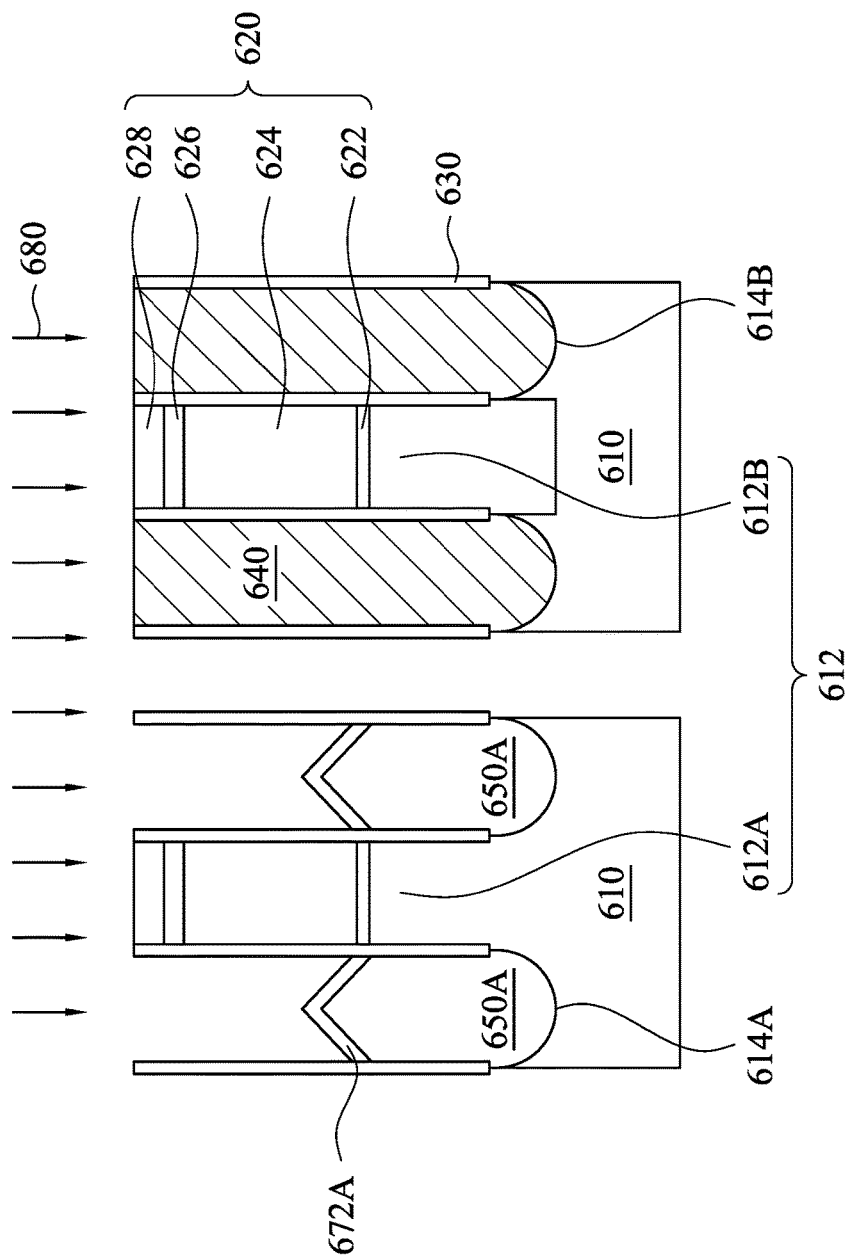

In FIG. 6A, a first wet etching operation 660A is performed on the SiN layer 640 and the $SiO_2$ layer 628, and further performed on the silicon-containing layer 650A, thereby removing a portion of the SiN layer 640 while the $SiO_2$ layer 628 and the silicon-containing layer 650A (please see FIG. 6B) remain. Detailed descriptions may be referred to the first wet etching operation 350 of FIG. 3A. It is noted that the first wet etching operation 660A may also provide an oxidation effect to the silicon-containing layer 650A, while the oxidation effect is insufficient to protect the silicon-containing layer 650A during the whole SiN layer removing process. Therefore, a first oxidation operation 670 is performed to form a first modified layer (or first oxidation layer) 672A, as shown in FIG. 6B and FIG. 6C. The first oxidation operation 670 and the first modified layer 672A of FIG. 6B and FIG. 6C are respectively similar to the first oxidation operation 360 and the first modified layer 322 of FIG. 3B and FIG. 3C.

Figure 6D:
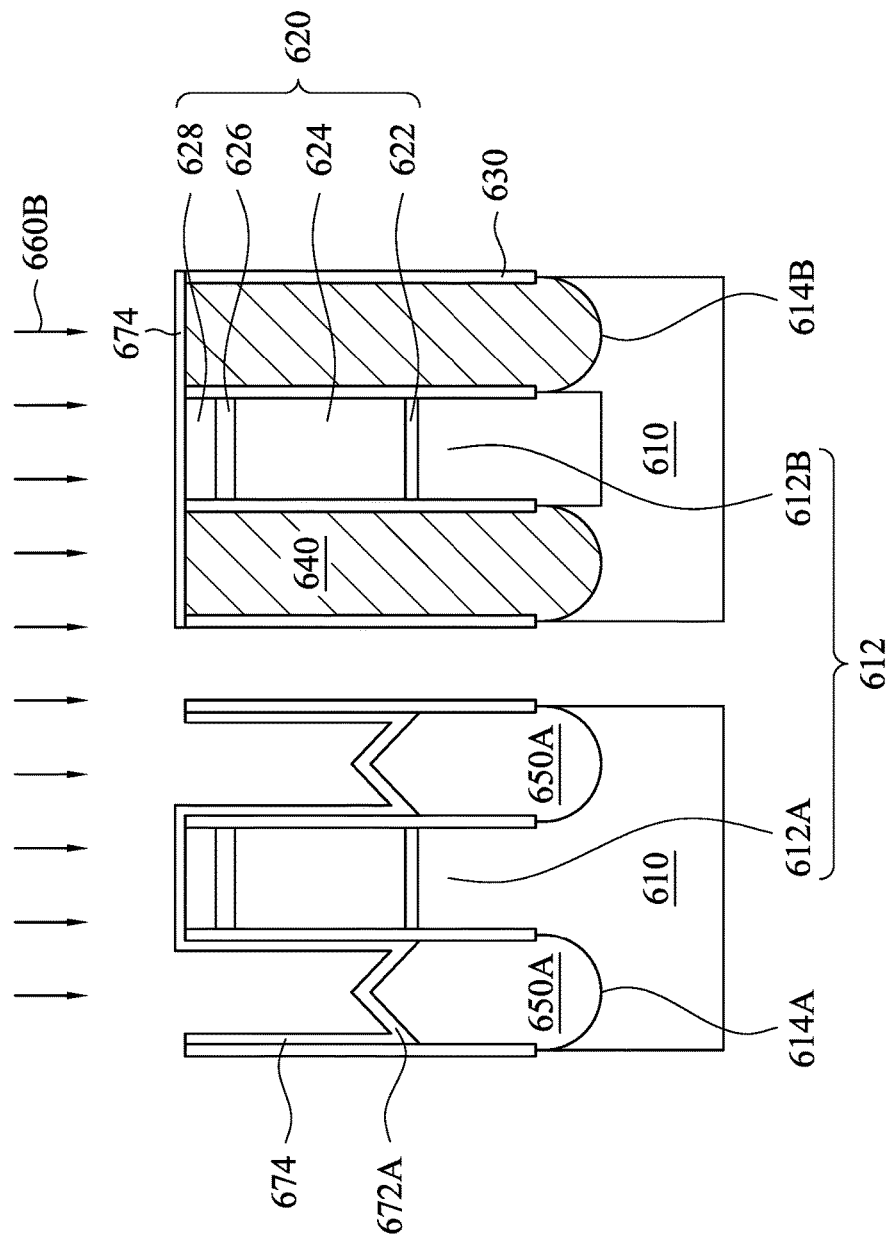
Figure 6E:
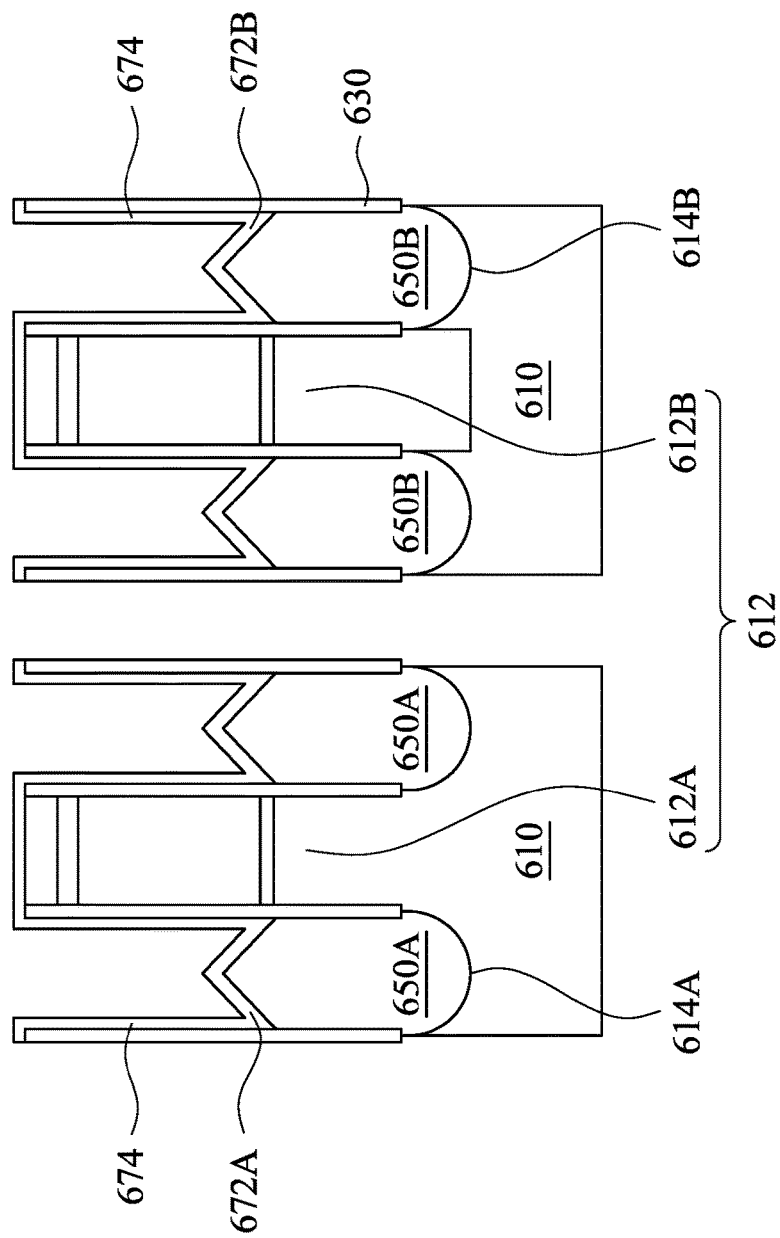

Next, at least one etching cycle is performed, and the etching cycle includes a surface modification treatment 670 and a second wet etching operation 660B, as shown in FIG. 6D and FIG. 6E. It is noted that, in other embodiments, more than one etching cycle may be performed. A second modified layer 674 (FIG. 6D) is formed on the $SiO_2$ layer 628 and the SiN layer 640 by the surface modification treatment 670. Detailed descriptions of the second modified layer 674, the surface modification treatment 670 and the second wet etching operation 660B may be referred to the second modified layer 380, the surface modification treatment 370 and the second wet etching operation 390 in FIG. 3C-FIG. 3H. After the etching cycle, the second recesses 614B are exposed (not shown). The above operations from forming the SiN layer 640 in FIG. 6A to removing the SiN layer 640 may be repeated to form the silicon-containing layer 650B in the second recesses 614B shown in FIG. 6E. The silicon-containing layer 650B is protected by the first modified layer 672B, which is formed in a similar way as the first modified layer 672A. Furthermore, the second modified layer 674 protects the $SiO_2$ layer 628 in the first fin 612A and the second fin 612B from being damaged during the wet etching operations.

Figure 6F:
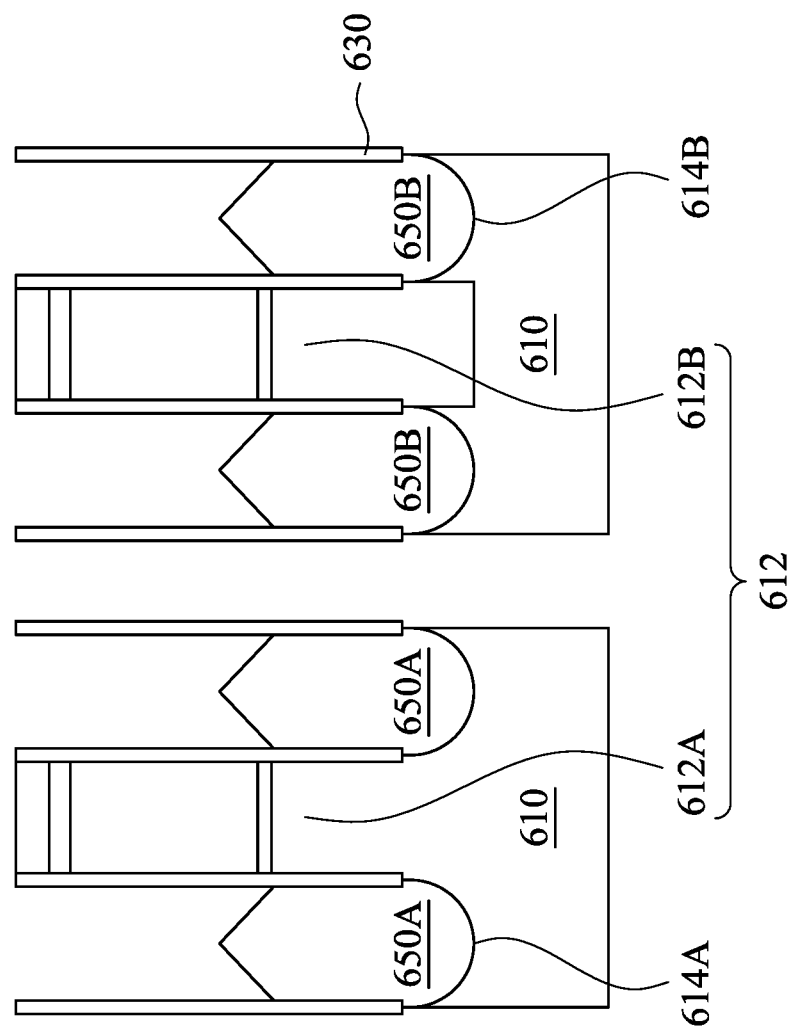

Then, as shown in FIG. 6F, the first modified layers 672A and 672B, and the second modified layer 674 are removed. Removal the first modified layers 672A and 672B, and the second modified layer 674 may be performed by the method similar to removal of the first modified layer 322 and the portion 380B of the second modified layer 380 in FIG. 3I.

Figure 7:
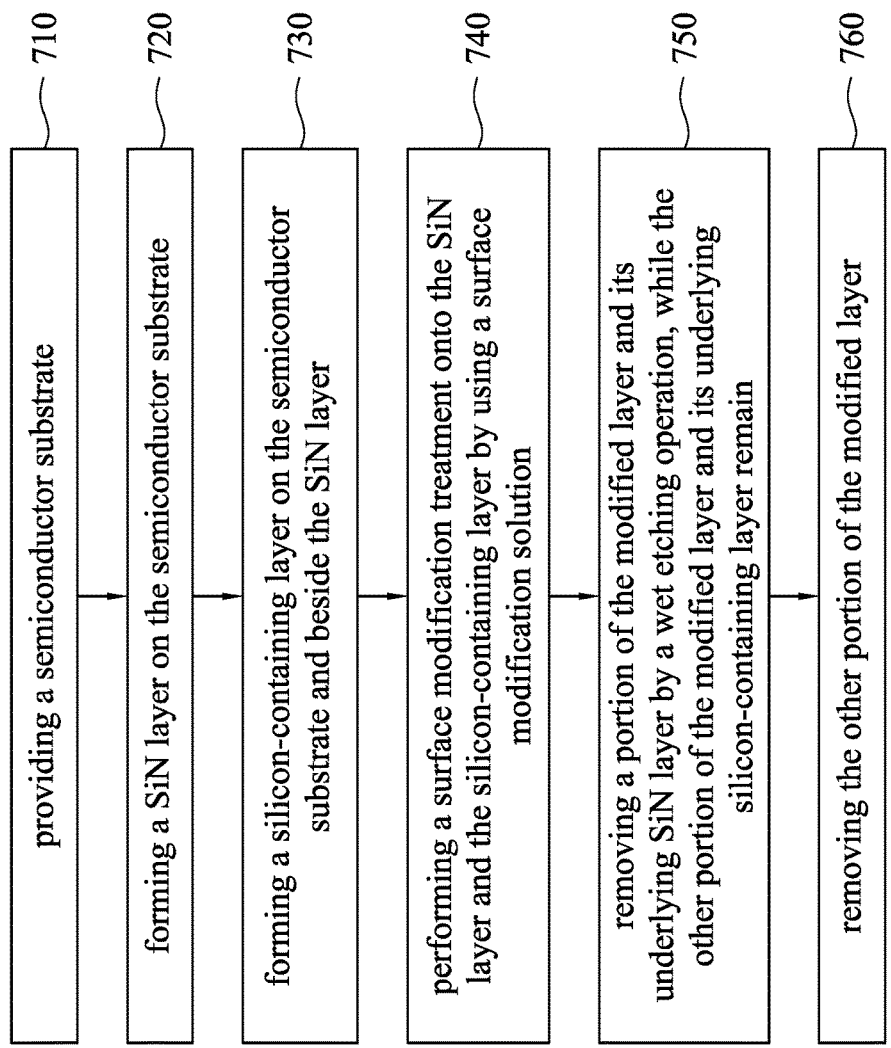
FIG. 7 is a flow chart showing an etching method with a surface modification treatment for forming a semiconductor structure in accordance with various embodiments of the present disclosure.

FIG. 7 is a flow chart showing an etching method 700 with a surface modification treatment for forming a semiconductor structure in accordance with various embodiments of the present disclosure. FIG. 1A through FIG. 1D are incorporated by reference. At operation 710 of the method 700, a semiconductor substrate is provided. At operation 720, a SiN layer is formed on the semiconductor substrate. At operation 730, a silicon-containing layer is formed on the semiconductor substrate and beside the SiN layer. The above operations are also shown in FIG. 1A. At operation 740 a surface modification treatment is performed onto the SiN layer and the silicon-containing layer by using a surface modification solution, as shown in FIG. 1A and FIG. 1B. At operation 750, a portion of the modified layer and its underlying SiN layer is removed by a wet etching operation, while the other portion of the modified layer and its underlying silicon-containing layer remain, as shown in FIG. 1B and FIG. 1C. At operation 760, the other portion of the modified layer is removed, as shown in FIG. 1D.

Figure 8:
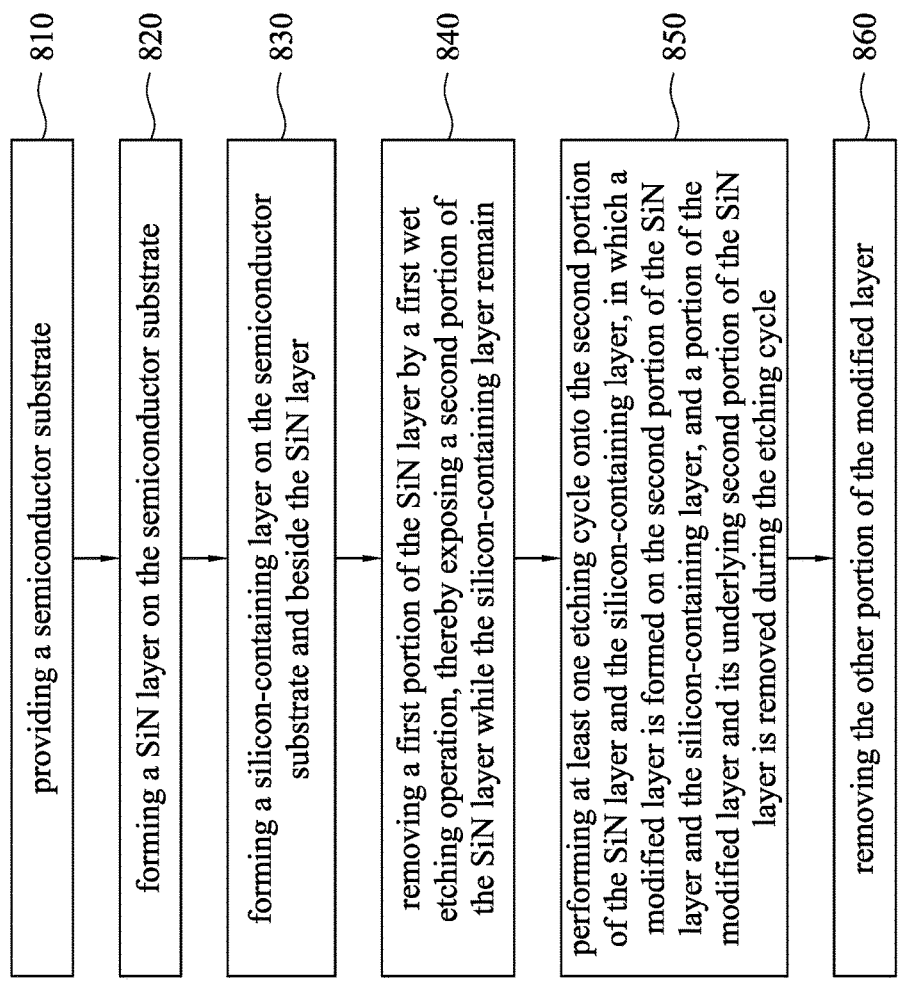
FIG. 8 is a flow chart showing an etching method with a surface modification treatment for forming a semiconductor structure in accordance with various embodiments of the present disclosure.

FIG. 8 is a flow chart showing an etching method 800 with a surface modification treatment for forming a semiconductor structure in accordance with various embodiments of the present disclosure. FIG. 2A through FIG. 2H are incorporated by reference. At operation 810 of the method 800, a semiconductor substrate is provided. At operation 820, a SiN layer is formed on the semiconductor substrate. At operation 830, a silicon-containing layer is formed on the semiconductor substrate and beside the SiN layer. The above operations are also shown in FIG. 2A. At operation 840, a first portion of the SiN layer is removed by a first wet etching operation, thereby exposing a second portion of the SiN layer while the silicon-containing layer remain, as shown in FIG. 2A and FIG. 2B. At operation 850, at least one etching cycle is performed on the second portion of the SiN layer and the silicon-containing layer, in which a modified layer is formed on the second portion of the SiN layer and the silicon-containing layer, and a portion of the modified layer and its underlying second portion of the SiN layer is removed during the etching cycle, as shown in FIG. 2B through FIG. 2G. At operation 860, the other portion of the modified layer is removed, as shown in FIG. 2H.

Figure 9:
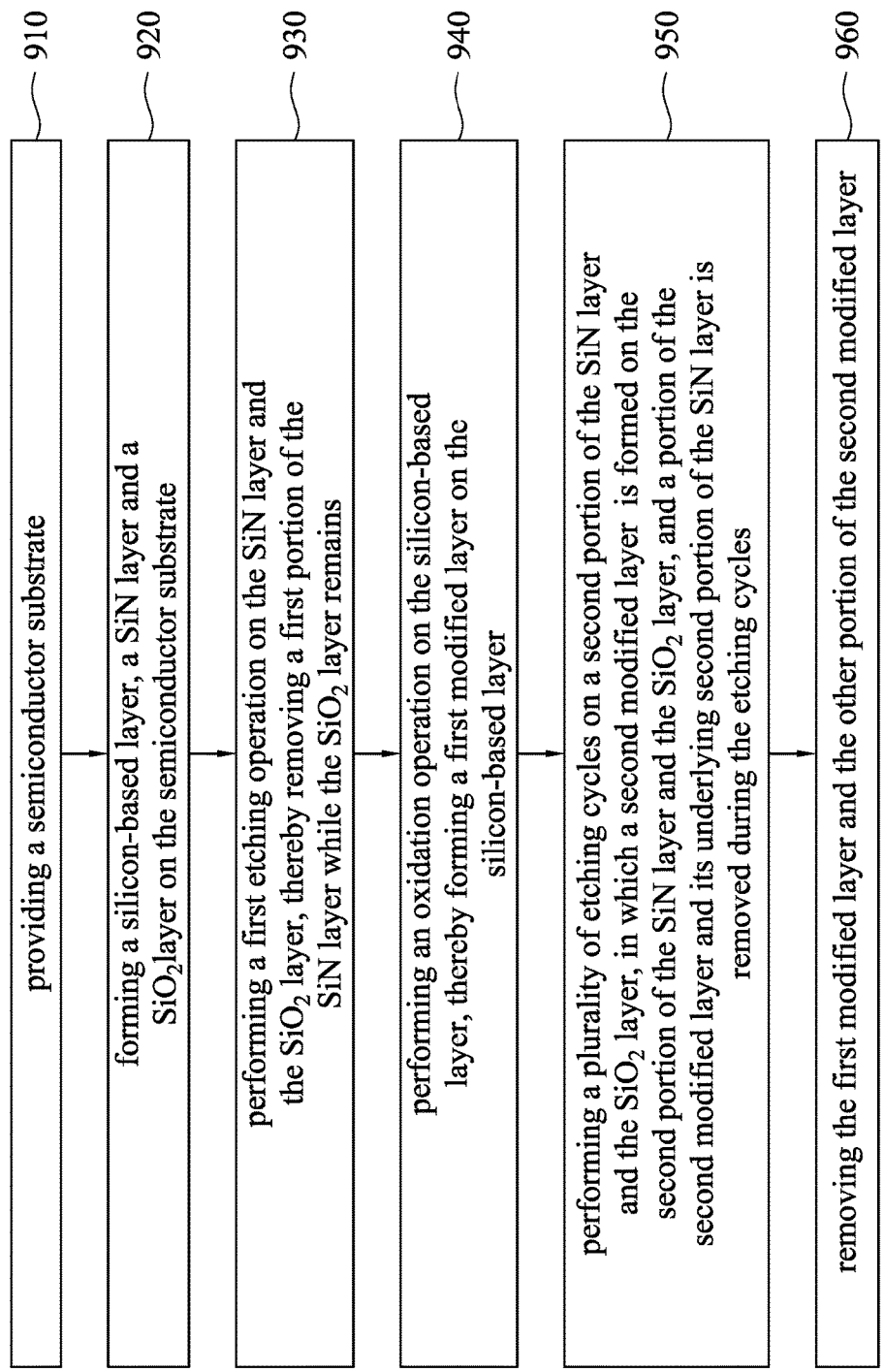
FIG. 9 is a flow chart showing an etching method with a surface modification treatment for forming a semiconductor structure in accordance with various embodiments of the present disclosure.

FIG. 9 is a flow chart showing an etching method 900 with a surface modification treatment for forming a semiconductor structure in accordance with various embodiments of the present disclosure. FIG. 3A through FIG. 3I are incorporated by reference. At operation 910, a semiconductor substrate is provided. At operation 920, a silicon-based layer, a SiN layer and a $SiO_2$ layer are formed on the semiconductor substrate, as shown in FIG. 3A. At operation 930, a first etching operation is performed on the SiN layer and the $SiO_2$ layer, thereby removing a first portion of the SiN layer while the $SiO_2$ layer remains, as shown in FIG. 3A and FIG. 3B. At operation 940, an oxidation operation is performed on the silicon-based layer, thereby forming a first modified layer on the silicon-based layer, as shown in FIG. 3B and FIG. 3C. At operation 950, etching cycles are performed on a second portion of the SiN layer and the $SiO_2$ layer, in which a second modified layer is formed on the second portion of the SiN layer and the $SiO_2$ layer, and a portion of the second modified layer and its underlying second portion of the SiN layer is removed during the etching cycles, as shown in FIG. 3C through FIG. 3H. At operation 960, the first modified layer and the other portion of the second modified layer are removed, as shown in FIG. 3I.

The method of forming a semiconductor structure of the present disclosure includes a surface modification treatment to protect a silicon-containing layer from being damaged during a wet etching operation. The method further includes an oxidation operation to protect a silicon-based layer including a n-type material or a p-type material. The surface modification treatment and the oxidation operation increase the selectivity between the SiN layer the silicon-containing layer during the wet etching operation. In addition, the method of the present disclosure can be applied to various semiconductor structures such as the RSS device, the device having the air gap or the vacuum gap, or typical source/drain region patterning process of the CMOS device.

According to some embodiments of the present disclosure, an etching method with a surface modification treatment for forming a semiconductor structure is provided. The method includes providing a semiconductor substrate, forming a silicon nitride (SiN) layer on the semiconductor substrate, and forming a silicon-containing layer on the semiconductor substrate and beside the SiN layer. The silicon-containing layer includes a silicon dioxide layer, a n-type silicon-containing layer, a p-type silicon-containing layer or a combination thereof. The method further includes performing a surface modification treatment onto the SiN layer and the silicon-containing layer by using a surface modification solution, thereby forming a modified layer on the SiN layer and the silicon-containing layer. The method further includes removing a portion of the modified layer and its underlying SiN layer by a wet etching operation, while the other portion of the modified layer and its underlying silicon-containing layer remain, and removing the other portion of the modified layer.

According to some embodiments of the present disclosure, an etching method with a surface modification treatment for forming a semiconductor structure is provided. The method includes providing a semiconductor substrate, forming a silicon nitride (SiN) layer on the semiconductor substrate, and forming a silicon-containing layer on the semiconductor substrate and beside the SiN layer. The silicon-containing layer includes a silicon dioxide layer, a n-type silicon-containing layer, a p-type silicon-containing layer or a combination thereof. The method further includes removing a first portion of the SiN layer by a first wet etching operation, thereby exposing a second portion of the SiN layer while the silicon-containing layer remains, and performing at least one etching cycle to the second portion of the SiN layer and the silicon-containing layer. The at least one etching cycle includes performing a surface modification treatment onto the second portion of the SiN layer and the silicon-containing layer by using a surface modification solution, thereby forming a modified layer on the second portion of the SiN layer and the silicon-containing layer. The at least one etching cycle further includes removing a portion of the modified layer and its underlying second portion of the SiN layer by a second wet etching operation, while the other portion of the modified layer and its underlying silicon-containing layer remain. The method of the present disclosure further includes removing the other portion of the modified layer.

According to some embodiments of the present disclosure, an etching method with a surface modification treatment for forming a semiconductor structure is provided. The method includes providing a semiconductor substrate, and forming a silicon-based layer, a SiN layer and a silicon dioxide ($SiO_2$) layer on the semiconductor substrate. The silicon-based layer is completely covered by a portion of the SiN layer, and a material of the silicon-based layer comprises a n-type silicon-based material or a p-type silicon-based material. The method further includes performing a first etching operation to the SiN layer and the $SiO_2$ layer, thereby removing a first portion of the SiN layer while the $SiO_2$ layer remains, performing an oxidation operation to the silicon-based layer, thereby forming a first modified layer on the silicon-based layer, and performing etching cycles on a second portion of the SiN layer and the $SiO_2$ layer. Each of the etching cycles includes performing a surface modification treatment onto the second portion of the SiN layer and the $SiO_2$ layer by using a surface modification solution, thereby forming a second modified layer on the second portion of the SiN layer and the $SiO_2$ layer. Each of the etching cycles further includes removing a portion of the second modified layer and its underlying second portion of the SiN layer by a second wet etching operation, while the first modified layer, its underlying silicon-based layer, the other portion of the second modified layer and its underlying $SiO_2$ layer remain. The method of the present disclosure further includes removing the first modified layer and the other portion of the second modified layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An etching method with a surface modification treatment for forming a semiconductor structure, comprising:
   providing a semiconductor substrate;
   forming a silicon nitride (SiN) layer on the semiconductor substrate;
   forming a silicon-containing layer on the semiconductor substrate and beside the SiN layer, wherein the silicon-containing layer comprises a silicon dioxide layer, a n-type silicon-containing layer, a p-type silicon-containing layer or a combination thereof;
   removing a first portion of the SiN layer by a first wet etching operation, thereby exposing a second portion of the SiN layer while the silicon-containing layer remains;
   performing at least one etching cycle to the second portion of the SiN layer and the silicon-containing layer, the at least one etching cycle comprising:
      performing a surface modification treatment onto the second portion of the SiN layer and the silicon-containing layer by using a surface modification solution, thereby forming a modified layer on the second portion of the SiN layer and the silicon-containing layer; and
      removing a portion of the modified layer and its underlying second portion of the SiN layer by a second wet etching operation, while the other portion of the modified layer and its underlying silicon-containing layer remain; and
   removing the other portion of the modified layer.

2. The method of claim 1, wherein forming the SiN layer on the semiconductor substrate further comprises:
   forming a fin structure on the semiconductor substrate;
   forming a dummy gate structure on the fin structure, wherein the dummy gate structure is substantially orthogonal to the fin structure;

forming a plurality of trenches in the fin structure on two opposite sides of the dummy gate structure;
conformally depositing a buffer oxide layer in the trenches; and
forming the SiN layer to fill the trenches and on the buffer oxide layer.

3. The method of claim 2, wherein forming the silicon-containing layer on the semiconductor substrate and beside the SiN layer further comprises:
replacing the dummy gate structure by a metal gate structure, wherein the metal gate structure comprises:
a metal gate layer; and
a high-k layer surrounding the metal gate layer; and
forming the silicon-containing layer over the metal gate layer and the high-k layer.

4. The method of claim 1, wherein forming the SiN layer on the semiconductor substrate further comprises:
forming a fin structure on a semiconductor substrate, wherein the fin structure comprises a first fin and a second fin, wherein the first fin comprises a n type material or a p type material, and the second fin comprises a material opposite to the first fin;
forming dummy gate structures respectively on the first fin and the second fin;
forming a spacer layer on sidewalls of the dummy gate structures;
recessing the first fin and the second fin on two respective sides of the corresponding dummy gate structures, thereby forming a plurality of first recesses in the first fin and a plurality of second recesses in the second fin; and
forming the SiN layer on one of each of the first recesses or each of the second recesses.

5. The method of claim 4, wherein forming the silicon-containing layer on the semiconductor substrate and beside the SiN layer further comprises:
forming the silicon-containing layer in the exposed first or second recesses, wherein the silicon-containing layer is the n-type silicon-containing layer, the p-type silicon-containing layer.

6. The method of claim 1, wherein forming the SiN layer on the semiconductor substrate further comprises:
forming a fin structure on the semiconductor substrate;
forming a dummy gate structure on the fin structure, wherein the dummy gate structure is substantially orthogonal to the fin structure;
forming the SiN layer conformal to sidewalls of the dummy gate structure;
forming a first spacer layer conformal to and covering the SiN layer;
recessing the fin structure on two opposite sides of the dummy gate structure, thereby forming a plurality of trenches; and
forming a source/drain region and an oxide layer in each of the trenches, wherein the oxide layer is formed over the source/drain region, and wherein forming the silicon-containing layer on the semiconductor substrate and beside the SiN layer further comprises:
replacing a dummy gate structure by a metal gate structure, wherein the metal gate structure comprises:
a metal gate layer; and
a high-k layer surrounding the metal gate layer; and
forming the silicon-containing layer over the metal gate layer and the high-k layer.

7. The method of claim 1, before removing the portion of the modified layer and its underlying second portion of the SiN layer of one or more etching cycles, the method further comprises:
performing a first oxidation operation on the silicon-containing layer, thereby forming a first oxidized layer on the silicon-containing layer, wherein the silicon-containing layer comprises the n-type silicon-containing layer or the p-type silicon-containing layer.

8. The method of claim 7, wherein the first oxidation operation is performed by applying an oxidizing solution to the silicon-containing layer.

9. The method of claim 8, wherein the oxidizing solution comprises aqueous ozone, hydrogen peroxide, a mixture of hydrogen peroxide and ammonium hydroxide, a mixture of sulfuric acid and hydrogen peroxide, or a mixture of hydrochloric acid and hydrogen peroxide.

10. The method of claim 1, wherein the first wet etching operation and the second wet etching operation are performed by applying phosphoric acid-containing solution.

11. The method of claim 1, wherein removing the other portion of the modified layer further comprises performing a second oxidation operation on the modified layer to form a second oxidized layer.

12. The method of claim 11, wherein removing the other portion of the modified layer further comprises removing the second oxidized layer by a pre-clean process.

13. The method of claim 1, after the at least one etching cycle and before removing the other portion of the modified layer, the method further comprises:
performing another surface modification treatment to form a modified layer to cover a top surface of the semiconductor structure.

14. The method of claim 1, wherein the surface modification solution comprises N,N-(dimethylamino)trimethylsilane.

15. The method of claim 1, wherein removing the other portion of the modified layer comprises directly performing a diluted hydrogen fluoride (DHF) cleaning operation on the modified layer.

16. A method of forming a semiconductor device, the method comprising:
providing a semiconductor substrate on which a silicon nitride layer and a silicon-containing layer are formed;
performing at least one etching cycle to the SiN layer and the silicon-containing layer, the at least one etching cycle comprising:
reacting a top surface of the SiN layer and a top surface of the silicon-containing layer with a surface modification solution, thereby modifying the top surface of the SiN layer and the top surface of the silicon-containing layer; and
removing at least a portion of the SiN layer by a wet etching operation, while the silicon-containing layer remains; and
removing the top surface of the silicon-containing layer.

17. The method of claim 16, further comprising performing the wet etching operation on the SiN layer and the silicon-containing layer prior to the at least one etching cycle.

18. The method of claim 16, wherein the at least one etching cycle is performed under a temperature of substantially 120° C.–170° C.

19. A method of forming a semiconductor device, the method comprising:

providing a semiconductor substrate on which a silicon nitride (SiN) layer and a silicon-containing layer are formed;

performing at least one etching cycle to the SiN layer and the silicon-containing layer until a predetermined thickness of the SiN layer is achieved, the at least one etching cycle comprising:

applying a silane compound on the SiN layer and the silicon-containing layer, thereby forming a modified layer on the SiN layer and a modified layer on the silicon-containing layer; and performing a wet etching operation on the modified layer of the SiN layer and the modified layer of the silicon-containing layer, wherein the wet etching operation has an etching selectivity to the modified layer on the SiN layer with respect to the modified layer on the silicon-containing layer; and removing the modified layer on the silicon-containing layer.

20. The method of claim 19, further comprising performing the wet etching operation on the SiN layer and the silicon-containing layer prior to the at least one etching cycle.

* * * * *